(12) United States Patent
Kanade et al.

(10) Patent No.: US 9,152,496 B2
(45) Date of Patent: Oct. 6, 2015

(54) HIGH PERFORMANCE FLASH CHANNEL INTERFACE

(75) Inventors: Ravindra K. Kanade, Austin, TX (US); Gregory Racino, Austin, TX (US); Michael Wiles, Round Rock, TX (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 1284 days.

(21) Appl. No.: 11/963,466

(22) Filed: Dec. 21, 2007

(65) Prior Publication Data

US 2009/0164704 A1   Jun. 25, 2009

(51) Int. Cl.
| | |
|---|---|
| G06F 12/00 | (2006.01) |
| H03M 13/00 | (2006.01) |
| G06F 11/10 | (2006.01) |
| G11C 16/10 | (2006.01) |
| G11C 29/04 | (2006.01) |

(52) U.S. Cl.
CPC ............ *G06F 11/1068* (2013.01); *G11C 16/10* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 7,106,636 | B2 * | 9/2006 | Eilert et al. .............. | 365/189.12 |
| 2002/0147882 | A1 * | 10/2002 | Pua et al. ...................... | 711/103 |
| 2004/0098549 | A1 * | 5/2004 | Dorst ............................ | 711/167 |
| 2004/0243906 | A1 * | 12/2004 | Huang .......................... | 714/758 |
| 2005/0185472 | A1 * | 8/2005 | Randell et al. ............ | 365/185.33 |
| 2006/0104115 | A1 * | 5/2006 | Chun et al. ................ | 365/185.17 |
| 2006/0282608 | A1 * | 12/2006 | Takemae ........................ | 711/101 |
| 2007/0168625 | A1 * | 7/2007 | Cornwell et al. ............. | 711/157 |
| 2008/0052448 | A1 * | 2/2008 | Minz et al. ..................... | 711/103 |
| 2008/0098277 | A1 * | 4/2008 | Hazelzet ....................... | 714/753 |
| 2008/0162789 | A1 * | 7/2008 | Choi et al. ..................... | 711/103 |
| 2008/0222491 | A1 * | 9/2008 | Lee et al. ....................... | 714/763 |
| 2008/0229000 | A1 * | 9/2008 | Kim .............................. | 711/103 |
| 2008/0250192 | A1 * | 10/2008 | Pua et al. ....................... | 711/103 |
| 2012/0124277 | A1 * | 5/2012 | Danilak et al. ................ | 711/103 |

OTHER PUBLICATIONS

Multiple-input gates, All About Circuits, Nov. 18, 2007, https://web.archive.org/web/20071118080653/http://www.allaboutcircuits.com/vol_4/chpt_3/4.html.*
Amber Huffman. Open NAND Flash Interface Specification, Revision 1.0. Dec. 28, 2006. 2005-2006, Hynix Semiconductor, Intel Corporation, Micron Technology, Inc., Phison Electronics Corp., Sony Corporation, STMicroelectronics.
Databahn™ Flash Memory Controller IP. 1994-2007 Denali Software, Inc. http://www.denali.com/products/databahn_flash.html. Last accessed Mar. 20, 2008.

* cited by examiner

*Primary Examiner* — Justin R Knapp

(57) ABSTRACT

Systems and/or methods that facilitate high performance flash channel interface techniques are presented. Integrated error correction code (ECC) engine and buffer sets facilitate bypassing error correction of data being written to or read from memory, such as flash memory, in addition to single ECC mode or multiple ECC mode. The integrated ECC engines and buffers can quickly analyze data, and provide error correction information or correct error, significantly increasing throughput. In addition, the programmable flash channel interface can provide more rapid development of flash products by accommodating both Open NAND Flash Interface (ONFI) standard flash and legacy flash devices, by using a configurable micro-code engine in the flash interface.

20 Claims, 15 Drawing Sheets

HIGH PERFORMANCE FLASH CHANNEL INTERFACE

TECHNICAL FIELD

The subject innovation relates generally to memory systems and in particular to systems and methods for implementing flash channel interfaces associated with a memory.

BACKGROUND

A wide variety of memory devices can be used to maintain and store data and instructions for various computers and similar systems. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash memory and NAND flash memory, for example. NAND flash memory evolved from DRAM technology and NOR flash memory evolved from electrically erasable read only memory (EEPROM) chip technology, in which, unlike flash memory, a single byte can be erased. While NAND flash is typically suitable for sequential access to handle semi-static data storage like pictures, music, etc., NOR flash is typically suitable for random access application such as code storage where execution in place is required (e.g., including set-top box applications, personal computers, cell phones, etc.). However, NAND flash can be used for some boot-up operations as well being combined with other memory types (e.g., DRAM) for execute in place functionality. In addition, flash memory devices typically are less expensive and more dense as compared to many other memory devices, meaning that flash memory devices can store more data per unit area.

Flash memory has become popular, at least in part, because it combines the advantages of the high density and low cost of EPROM with the electrical erasability of EEPROM. Flash memory is nonvolatile; it can be rewritten and can hold its content without power. It can be used in many portable electronic products, such as cell phones, portable computers, voice recorders, thumbnail drives and the like, as well as in many larger electronic systems, such as cars, planes, industrial control systems, etc. The fact that flash memory can be rewritten, as well as its ability to retain data without a power source, small size, and light weight, have all combined to make flash memory devices useful and popular means for transporting and maintaining data.

Although NAND flash memory chips from different vendors often use similar packaging, have similar pinouts, and accept similar sets of low-level commands, subtle differences in timing and/or command set can provide suboptimal performance if the flash controller (e.g., flash channel interface) is not specifically designed and tested for the specific NAND flash implementation. As a result, flash products typically require thorough debugging and testing to incorporate a new and/or different model of flash chip. In addition, multi-vendor flash controllers must typically store a table of supported flash devices in firmware to deal with differences in the flash device interfaces. Accordingly, this can result in increased cost, complexity, and time-to-market of flash based products, in addition to potential incompatibility with future NAND flash releases where required firmware update would otherwise be required. Thus a flash channel interface that can be flexibly and rapidly reprogrammed to accommodate various flash device implementations is desired to reduce cost, complexity, and time to market.

One effort to mitigate such development complexities is the Open NAND Flash Interface Working Group (ONFI). ONFI is a consortium of technology companies working to develop open standards for NAND flash memory chips and devices that communicate with them. ONFI seeks to standardize the low-level interface to raw NAND flash chips, which are the most widely used form of non-volatile memory integrated circuits. As NAND flash becomes more of a commodity product, one main motivation for standardization of NAND flash is to make it easier to switch between NAND chips from different producers, thereby permitting faster development of NAND-based products and lower prices via increased competition among manufacturers. ONFI has produced a specification Version 1.0 for a standard interface to NAND flash chips. The current specification includes a standard physical interface, NAND chip self-identification and self-description standards, timing requirements, standard command set (e.g., command numbers and addressing scheme) for reading, writing, and erasing NAND flash in addition to performance and data integrity improvements. Thus, in addition to accommodating various proprietary or legacy NAND flash implementations, an improved flash channel interface should be able to accommodate such ONFI standard based flash implementations.

In addition to design flexibility, as file and resultant flash device sizes continue to increase, maintaining or increasing read/write speeds while maintaining data integrity will become an increasingly crucial design challenge. For example, error-correcting codes (ECC) have been employed in NAND flash devices in order to cope with the charge loss/gain mechanism and resultant error. However, conventional error detection and correction techniques take a substantial amount of time to conduct in flash memory operations. Moreover as flash memory ages, the number of errors for which error correction is required can increase, further exacerbating the problem. Thus, significant data throughput increases are desired, which can be directed in part at improvements over conventional ECC techniques (e.g., schemes that read out the data from flash then perform ECC functions on the data).

The above-described deficiencies are merely intended to provide an overview of some of the problems encountered in flash channel interface designs and are not intended to be exhaustive. Other problems with the state of the art may become further apparent upon review of the description of the various non-limiting embodiments of the subject innovation that follows.

SUMMARY

The following presents a simplified summary of the subject innovation in order to provide a basic understanding of some aspects described herein. This summary is not intended to be an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems, methods, and devices that facilitate improved flash read/write speed while maintaining data integrity through improved error detection and correction techniques in memory devices (e.g., flash memory devices). According to various aspects of the subject innovation, the provided Flash Channel Interface (FCI) techniques enable flexible, configurable, and programmable interfaces to facilitate high speed flash memory operations. In addition, the provided techniques can perform error detection and correction within the flash controller or controller interface to maintain data integrity according to various aspects described herein.

In various embodiments of the subject innovation, a method is provided facilitating flash memory access comprising configuring flash memory timing in a flash controller, preparing a command sequence comprising micro-operations to facilitate flash memory access by the flash controller, in addition to indicating in the flash controller a flash memory device, a data size, a column address, and a row address based on the command sequence. The method can further include executing the command sequence by executing the micro-operations in a specified sequence in addition to performing error detection and correction and buffering for the data of interest in one or more of a plurality of buffer and error detection and correction engine sets of the flash controller. In addition, the method can include specifying an error correction mode as more fully described herein, in addition to determining an indication of flash memory access completion.

In further non-limiting embodiments of the subject innovation, the method can comprise configuring the flash memory timing by writing to read and write timing registers of the flash controller, storing the micro-operations in one or more micro-operation sequence registers of the flash controller, indicating for the data of interest by configuring in the flash controller a flash memory device select indicator, a data size register, a column address register, and a row address register, according to the command sequence, and storing the command sequence in a command register of the flash controller based in part on the micro-operations stored in the one or more micro-operation sequence registers.

In a related embodiment, a system that facilitates access to a flash memory device, comprising a programmable flash interface component for executing one or more flash memory operations, a plurality of data buffers for storing data in transit within the system, and a plurality of error detection and correction engines, where each of the plurality of error detection and correction engines is associated with a respective one of the plurality of data buffers. The system can further include a plurality of registers for configuring the programmable flash interface component to facilitate executing the one or more flash memory operations to provide access to the flash memory device, and an external interface that is accessible by a processor communicatively coupled the interface, where the processor is operable to configure and control the programmable flash interface component via one or more of the plurality of registers.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
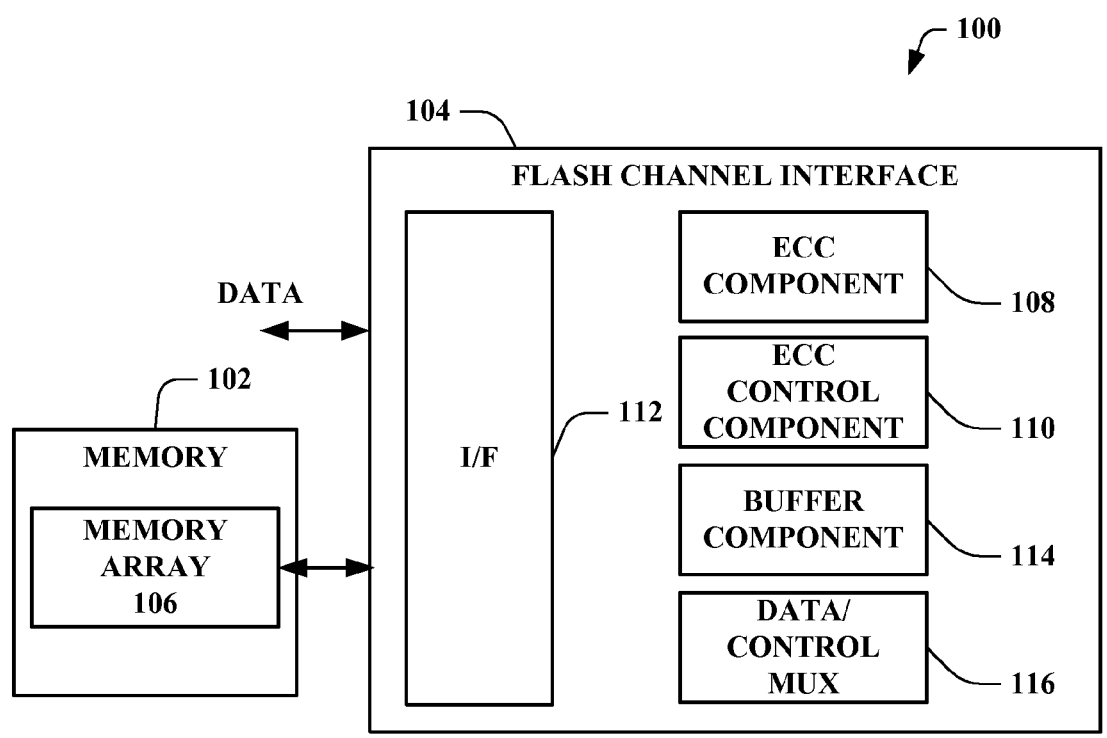
FIG. 1 illustrates a block diagram of a system suitable for incorporation of aspects of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

According to various non-limiting embodiments of the subject innovation, a high performance Flash Channel Interface (FCI) is provided.

According to various aspects of the subject innovation, the provided FCI techniques enable flexible, configurable, and programmable interfaces to facilitate high speed flash memory operations. In some aspects, the provided techniques advantageously allow use of MultiMediaCard (MMC), Universal Serial Bus (USB) or any other standard interface to access flash devices. According to further aspects of the subject innovation, firmware can be embedded within an embedded controller flash rather than on a flash chip thereby enhancing data access speeds. In addition, the provided techniques can perform error correction essentially in real-time to maintain data integrity while further enhancing access speeds according to various aspects described herein.

While the term ECC is typically used to refer to error correction codes or coding, it should be noted that as used herein, depending on the usage context of the abbreviation ECC, the abbreviation can refer to the entire process or functionality of generating error detection information for an associated element of data as well as the process of or functionality for analyzing a received data element and its associated error detection information for the purposes of detecting and correcting errors in the data element. For the avoidance of doubt, such usage is particularly intended with respect to the terms "ECC engine" and "ECC techniques," which could be expressed equivalently as error detection and correction engine and error detection and correction techniques respectively.

As described above, conventional error detection and correction techniques (e.g., schemes that read out the data from flash then perform ECC functions on the data) take a substantial amount of time to conduct in flash memory operations. Moreover as flash memory ages, the number of errors for which error correction is required can increase, further exacerbating the problem. According to various non-limiting embodiments of the subject innovation, substantially real-time error correction can be performed through the provided techniques. For example, as bit error rate goes up as flash memory ages, the overall throughput of the system can be maintained or the detriment minimized through the use of multiple buffer and ECC engines and associated ECC techniques disclosed herein.

In addition, because NAND flash can typically take from about 25 microseconds to 1000's of microseconds to perform an operation, the provided flash channel interface, or portions thereof (e.g., a NAND flash interface (NFI)), can interleave data such that the throughput can be further improved by performing multiple operations on the flash devices almost concurrently, according to various aspects described herein. For example, while the FCI is waiting on a pending NAND flash operation, another capable flash device can be triggered to perform an operation such that flash operations can be performed in parallel. Moreover, such functions can be managed by the FCI through instructions received over a bus (e.g., an Advanced Microcontroller Bus Architecture (AMBA) High-performance Bus (AHB)). In addition, the FCI can facilitate a Direct Memory Access (DMA) Interface to the AHB bus.

Turning to FIG. 1, illustrated is a system 100 suitable for incorporation of aspects of the subject matter disclosed herein. The system 100 can include a memory 102 that can receive and store data. System 100 can further include an improved flash channel interface 104 according to the techniques described herein that can provide high speed read/write data access to the non-volatile memory 102, such as a flash memory device (e.g., single-bit flash memory, multi-bit flash memory, etc.). In one aspect, the flash memory can comprise NAND flash memory and/or NOR flash memory. The memory 102 can be comprised of one or more memory arrays 106 and can include a plurality of arrayed memory cells (not shown) wherein each memory cell can store one or more bits of data. Data stored in a memory cell(s) in the memory 102 can also be read and such data can be provided as an output.

The flash channel interface 104 can also include an ECC component 108 that can facilitate substantially real-time data analysis and error correction of data associated with the memory 102. The ECC component 108 can employ ECC (e.g., Reed Solomon code, Hamming code, Trellis encoding with Bose, Ray-Chaudhuri, Hocquenghem (BCH) engine, and the like) to facilitate encoding of data being written to a memory location(s) (e.g., memory cell(s)) in the memory array 106 and/or decoding of data being read from a memory location(s) in the memory 102. For example, the ECC component 108 can facilitate generating redundant bits (e.g., parity data) with a value that can be based on data being written to memory 102. The redundant bits can be stored in the memory location with the associated data, or can be stored in a different memory location. The redundant data can be utilized to facilitate error correction of the associated data when the data is read from the memory 102. In accordance with one embodiment of the disclosed subject matter, BCH code can be employed to facilitate error correction of data.

The flash channel interface 104 can further include an ECC control component 110 that can facilitate management of error correction of data, for example, by facilitating enabling and/or disabling error correction (e.g., bypass mode) with regard to a particular element (e.g., block, page, chunk, byte, word, bit, etc.) of data, or changing error correction modes (e.g., single to dual mode ECC) as described in further detail below, for example, in connection with FIG. 6. Additionally, flash channel interface 104 can include an interface component 112 that provides a configurable and programmable interface to the memory 102. In addition, the flash channel interface 104 can include a buffer component 114 to facilitate buffering data during flash reads or flash writes in addition to data/control mux 116 to facilitate controlling various connections between and among the interface component 112, the buffer component 114, and the ECC components 108 and 110, among other related functions.

Figure 2:
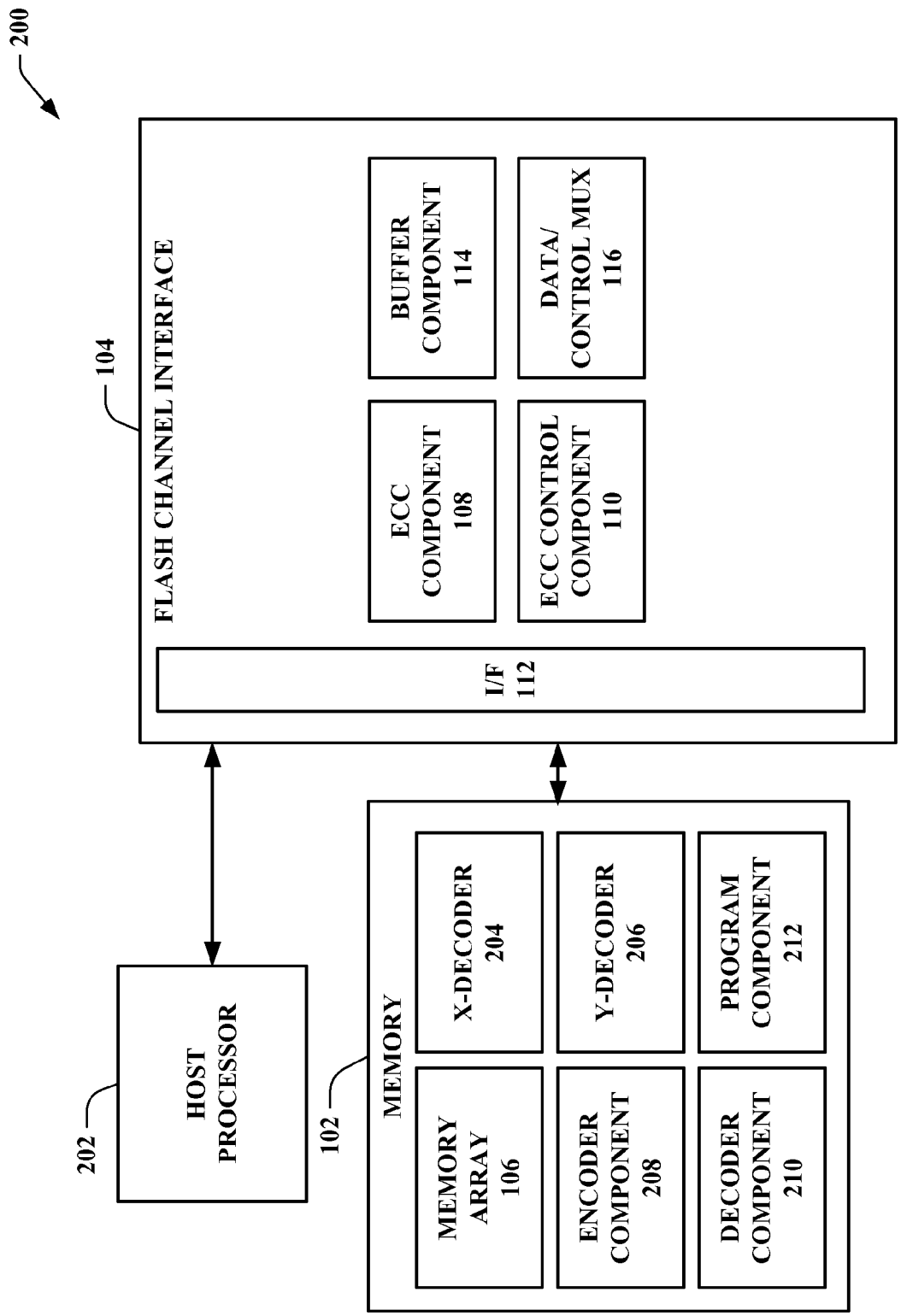
FIG. 2 depicts a block diagram of a system that facilitates improved flash read/write speed while maintaining data integrity through error detection and correction in accordance with various aspects of the disclosed subject matter.

Referring to FIG. 2, depicted is a block diagram of system 200 that can facilitate high speed flash operations while maintaining data integrity in accordance with the disclosed subject matter. System 200 can include a memory 102 that can be a non-volatile memory such as a flash memory (e.g., single-bit flash memory, multi-bit flash memory). The memory 102 can be comprised of NOR flash memory and/or NAND flash memory, or any combination thereof, for example. The memory 102 can include a memory array 106 that can be comprised of a plurality of memory cells (not shown) wherein data can be stored, as more fully described herein.

The system 200 can further include a flash channel interface 104 that can comprise an ECC component 108 that can facilitate error correction of data, as described herein, for example, in connection with FIG. 1. Flash channel interface 104 can also include an ECC control component 110 that can facilitate error correction of data in the memory 102 by controlling (e.g., enabling, disabling, changing modes) error correction associated with an element of data. It is to be appreciated that the memory 102, memory array 106, ECC component 108, ECC control component 110, buffer component 114, and data/control mux 116 can each include their respective functionality, as more fully described herein, for example, with regard to system 100.

System 200 can also include a host processor 202 that can be associated with the memory 102. In accordance with an embodiment of the disclosed subject matter, the host processor 202 can be a typical applications processor that can manage communications and run applications. For example, the host processor 202 can be a processor that can be utilized by a computer, a mobile handset, personal data assistant (PDA), or other electronic device. The host processor 202 can generate commands, including read, write, and/or erase commands, in order to facilitate reading data from, writing data to, and/or erasing data from the memory 102, where the communication of information between the host processor 202 and the memory 102 can be facilitated via an interface component 112 ("I/F 112").

I/F 112 can include and/or provide various adapters, connectors, channels, communication paths, etc. to integrate the memory 102 into virtually any operating and/or database system(s) and/or with one another system(s). In addition, I/F 112 can provide various adapters, connectors, channels, communication paths, etc., that can provide for interaction and/or communication with the host processor 202, and/or any other component, data, and the like, associated with the system 200.

The memory 102 can include an X-decoder component 204 and a Y-decoder component 206 that can be associated with the memory array 106 and can each respectively decode inputs/outputs during various operations (e.g., programming, reading, verifying, erasing) that can be performed on the memory cells (not shown), as more fully described herein. For example, the X-decoder component 204 and Y-decoder component 206 can each receive address bus information, which can be provided as part of a command from the host processor 202 or a command from a memory controller component (not shown) within the memory 102, and such information can be utilized to facilitate determining the desired memory location in the memory 102.

The memory 102 can also contain an encoder component 208 that can facilitate encoding data being programmed to the memory 102. For example, the encoder component 208 can facilitate converting a digital signal to an analog signal (e.g., current level) to facilitate programming data in the memory locations (e.g., memory cells) in the memory 102. The encoder component 208 can also be associated with the ECC component 108 to facilitate generating ECC data that can be associated with an element of data being programmed into the memory 102 to facilitate error correction of the element of data when error correction is enabled, for example, when the element of data is read from the memory 102.

The memory 102 can further include a decoder component 210 that can facilitate decoding data being read from the memory 102. The decoder component 210 can receive an analog signal associated with data, where the analog signal can be stored in the memory location in the memory 102, and can facilitate converting the analog signal to a digital signal, so that such digital signal representing the read data can be provided to another component (e.g., host processor 202, cryptographic component (as described herein), etc.) for further processing. The decoder component 210 can be associated with the ECC component 108 to facilitate error detection and/or correction of the data being read from memory, where the ECC information associated with the data can be employed to facilitate error detection/correction, when error correction is enabled.

The encoder component 208, decoder component 210, and/or ECC component 108 can be associated with the ECC control component 110 that can facilitate enabling and/or disabling error correction with regard to an element (e.g., block, page, chunk, byte, word, bit, etc.) of data or changing ECC modes as more fully described herein. The ECC control component 110 can communicate that error detection/correction is enabled for such element of data to facilitate analysis of ECC information associated with the element of data and stored in the desired memory location and/or facilitate error detection/correction of the element of data when it is read from the memory location in memory 102. Conversely, the ECC control component 110 can facilitate disabling error detection/correction of data or changing ECC modes. For example, the ECC control component 110 can communicate that error detection/correction is disabled with regard to the data stored in the memory location to the ECC component 108, encoder component 208, and/or decoder component 210.

The memory 102 also can contain a program component 212 that can facilitate various types of programming operations to write data to the memory 102. For example, the program component 212 can operate in a write buffer mode where larger amounts of data can be written to a memory location(s) in the memory 102. The data can be temporarily stored in a buffer component 114 or other associated buffer component (not shown), which can be a memory or storage component (e.g., static random access memory (SRAM), etc.). The program component 212 can also operate in word/byte mode such that relatively small amounts of data can be programmed into a memory location(s) in the memory 102.

Figure 3A:
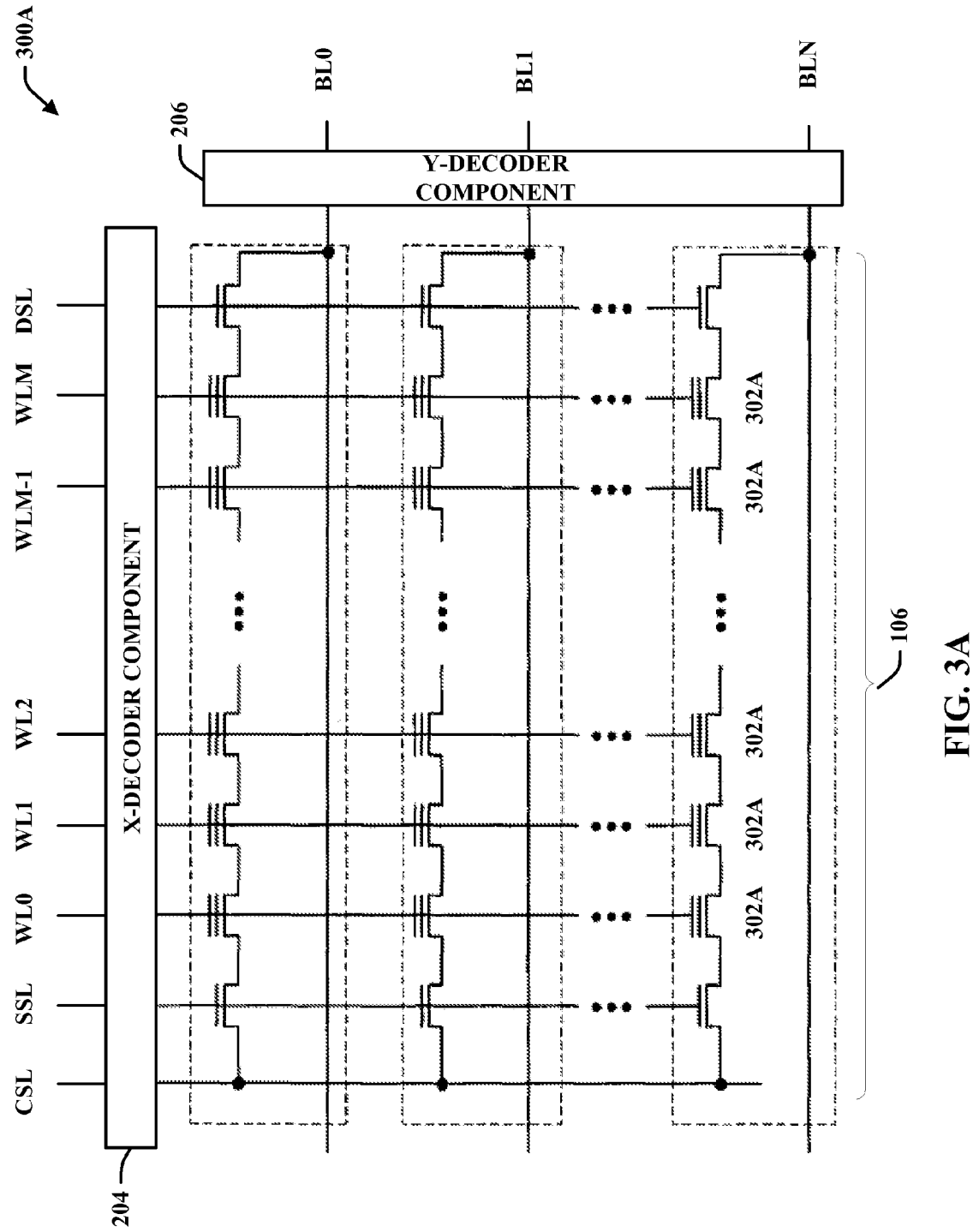
FIG. 3A depicts a block diagram of an exemplary NAND memory array in accordance with the disclosed subject matter.
Figure 3B:
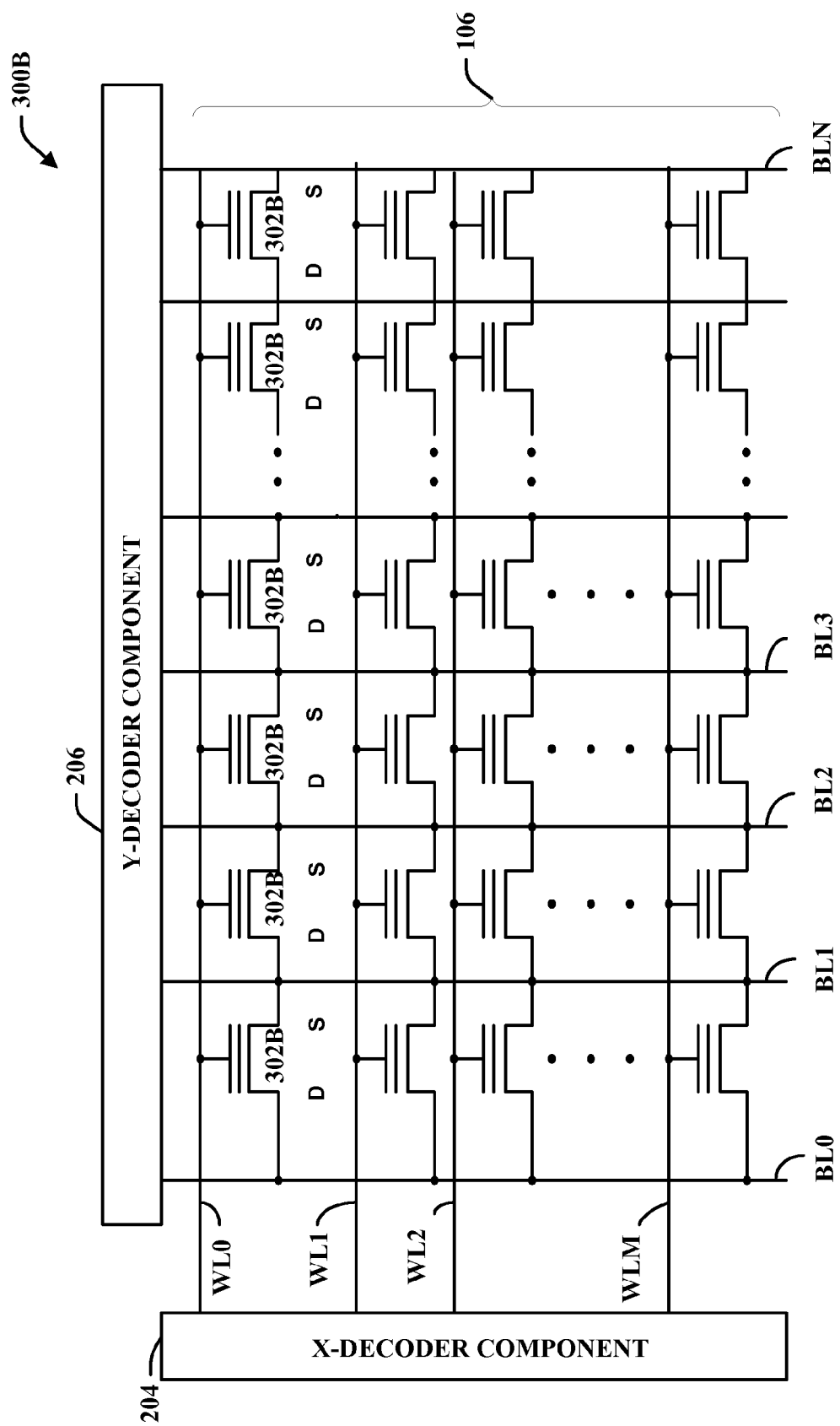
FIG. 3B depicts a block diagram of an exemplary NOR memory array in accordance with the disclosed subject matter.

Turning to FIGS. 3A and 3B, depicted are an example diagrams 300A and 300B of NAND and NOR memory arrays 106, respectively, that can be employed in a memory 102 in accordance with the disclosed subject matter. The diagrams 300A and 300B (collectively 300) of the memory array 106 can include a plurality of memory cells 302A or 302B (hereinafter also referred to collectively as "memory cell 302" or "memory cells 302") that each can be comprised of a drain, gate, and source. Each memory cell 302 can have one or more levels therein and can thereby store one or more bits of data therein, where each level can be associated with a bit of data. The memory array 106 can be included in a memory 102 (not shown in its entirety). The memory array 106 can be associated with an X-decoder component 204 (e.g., word line (WL) decoder) and a Y-decoder component 206 (e.g., bit line (BL) decoder) that can each respectively decode inputs/outputs during various operations (e.g., programming, reading, verifying, erasing) that can be performed on the memory cells 302. The X-decoder component 204 and Y-decoder component 206 can each receive address bus information from a host processor (e.g., 202) and/or system controller (not shown) or the like, and can utilize such information to facilitate accessing or selecting the desired memory cell(s) (e.g., memory location(s)) associated with the command. The memory cells 302 can be formed in M rows and N columns. A common WL can be attached to the gate of each memory cell 302 in a row, such as word-lines WL0, WL1, WL2, through WLM. A common BL can be attached to each cell 302B in a column (e.g., in the case of NOR flash) or collectively to cells 302A in the (e.g., in the case of NAND flash), such as bit-lines BL0, BL1, through BLN as depicted in the respective diagrams. A WL can contain, for example, 1024 elements forming multiple words and a sector can include, for example, 512 WLs to provide at least 512 k elements of memory. In accordance with an aspect of the disclosed subject matter, respective voltages can be applied to one or more cells 302 through the WLs and BLs to facilitate performing operations, such as program, read, erase, and the like.

Figure 4:
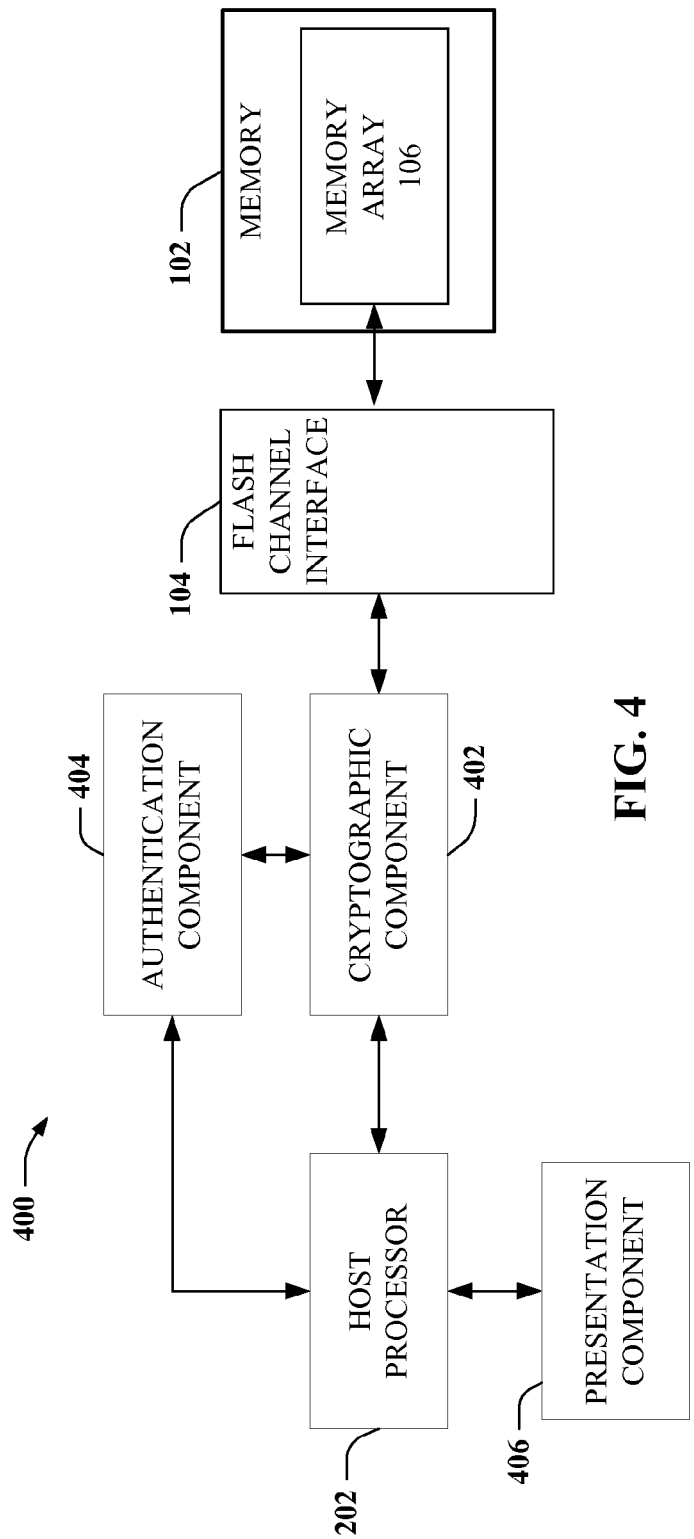
FIG. 4 illustrates a block diagram of a system that facilitates improved flash read/write speed while maintaining data integrity through error detection and correction, data security, and user interactivity in accordance with various aspects of the disclosed subject matter.

Referring to FIG. 4, a block diagram of a system 400 that facilitates improved flash read/write speed while maintaining data integrity through ECC for secured data in accordance with the disclosed subject matter is illustrated. System 400 can include a host processor 202 that can be associated with a memory 102, which can be a flash memory device, for example. The memory 102 can include a memory array 106 in which data can be stored. In addition, system 400 can include flash channel interface 104 that provides a configurable and programmable interface to the memory 102 as more fully described herein. It is to be appreciated that the memory 102, memory array 106, flash channel interface 104, and host processor 202 can each include their respective functionality, as more fully described herein, for example, with regard to system 100 and/or system 200.

The host processor 202 can be associated with a cryptographic component 402 that can facilitate encrypting and/or decrypting data to facilitate securing data being written to, stored in, and/or read from the memory 102. In accordance with an aspect of the disclosed subject matter, cryptographic component 402 can provide symmetric cryptographic tools and accelerators (e.g., Twofish, Blowfish, AES, TDES, IDEA, CAST5, RC4, etc.) to facilitate securing the memory 102 and data associated therewith. Cryptographic component 402 can also provide asymmetric cryptographic accelerators and tools (e.g., RSA, Digital Signature Standard (DSS), and the like) to facilitate securing the memory 102 and data associated therewith. Additionally, cryptographic component 402 can provide accelerators and tools (e.g., Secure Hash Algorithm (SHA) and its variants such as, for example, SHA-0, SHA-1, SHA-224, SHA-256, SHA-384, and SHA-512) to facilitate securing the memory 102 and data associated therewith.

System 400 can further include an authentication component 404 that can solicit authentication data from an entity, and, upon receiving the proper authentication data so solicited, can be employed, individually and/or in conjunction with information acquired and ascertained as a result of biometric modalities employed, to facilitate control access to the memory 102. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by authentication component 404. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component 404 can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity. In accordance with one embodiment of the disclosed subject matter, the memory 102, the cryptographic component 402, and the authentication component 404 can be situated or implemented on a single integrated-circuit chip. In accordance with another embodiment, the memory 102, the cryptographic component 402, and the authentication component 404 can be implemented on an application-specific integrated-circuit (ASIC) chip.

Figure 5:
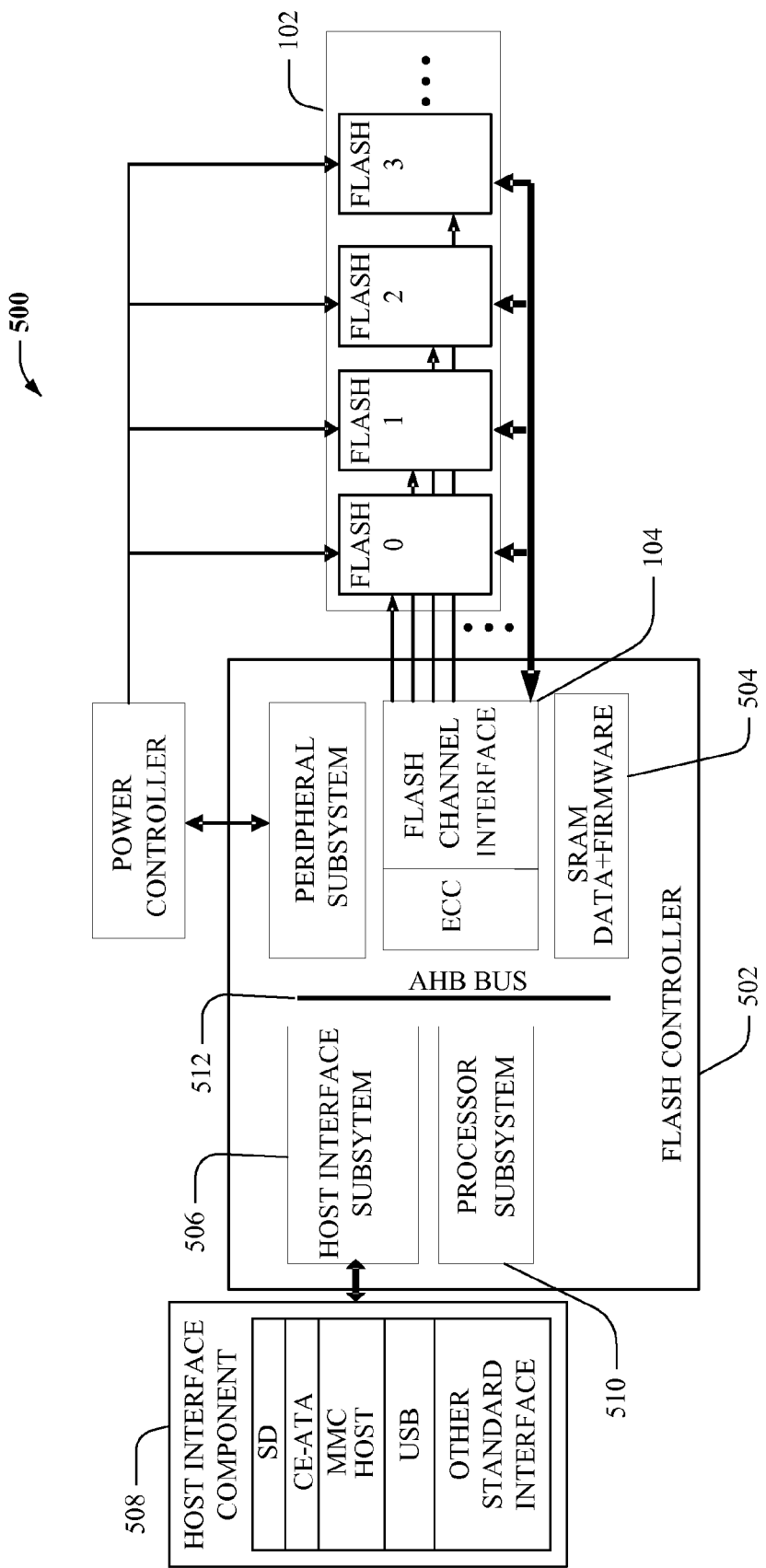
FIG. 5 illustrates a block diagram of an exemplary non-limiting embodiment of a flash controller system suitable for implementing the improved flash read/write and error detection and correction techniques in accordance with various aspects of the disclosed subject matter.

Referring again to FIG. 4, system 400 can also include a presentation component 406, which can be associated with the host processor 202, and which can facilitate user access to the memory 102 via a host interface (e.g., as illustrated and described in connection with FIG. 5). The presentation component 406 can provide various types of user interfaces to facilitate interaction between a user and any component coupled to the host processor 202. As depicted, the presentation component 406 is a separate entity that can be utilized with the host processor 202 and associated components. However, it is to be appreciated that the presentation component 406 and/or similar view components can be incorporated into the host processor 202 and/or a stand-alone unit. The presentation component 406 can provide one or more graphical user interfaces (GUIs), command line interfaces, and the like. For example, a GUI can be rendered that provides a user with a region or means to load, import, read, etc., data, and can include a region to present such results. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the host processor 202.

The user can also interact with the regions to select and provide information via various devices such as a mouse, a roller ball, a keypad, a keyboard, a pen and/or voice activation, for example. Typically, a mechanism such as a push button or the enter key on the keyboard can be employed to facilitate entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

System 100, system 200, system 400 and/or system 500 or portions thereof, can be employed in virtually any electronic device where security of data is desired. Examples of such electronic devices can include a computer, a cellular phone, a digital phone, a video device (e.g., video playing and/or recording device), a smart card, a personal digital assistant (PDA), a television, an electronic game (e.g., video game), a digital camera, an electronic organizer, an audio player and/or recorder, an electronic device associated with digital rights management, Personal Computer Memory Card International Association (PCMCIA) cards, trusted platform modules (TPMs), an electronic control unit (ECU) associated with a motor vehicle (e.g., ECU associated with fuel injection system), a global positioning satellite (GPS) unit, an electronic device associated with airplanes, an electronic device associated with industrial control systems, Hardware Security Modules (HSMs), a set-top box, a secure memory device with computational capabilities, a device with a tamper-resistant chip(s), and the like.

According to various aspects of the subject innovation, the provided flash channel interface techniques enable flexible, configurable, and programmable interfaces to facilitate high speed flash memory operations while maintaining data integrity through error detection and correction. For example, FIG. 5 illustrates a block diagram of an exemplary non-limiting embodiment of a flash controller system 500 suitable for implementing the improved flash read/write and ECC techniques in accordance with various aspects of the disclosed subject matter. According to various non-limiting embodiments of the subject innovation, a provided high performance FCI can be incorporated into a flash controller system 500.

The flash controller system 500 can comprise a flash controller 502, which can further include a FCI 104 as described herein. In various embodiments, firmware can be embedded within a controller flash (not shown), embedded or otherwise, and executed in an embedded SRAM 504, rather than on a flash chip (e.g., memory 102) thereby enhancing data access speeds. In addition, the provided techniques can perform error correction to maintain data integrity according to various aspects described herein. In some aspects, flash controller system 500 can include required functionality in a host interface subsystem 506 (e.g., protocol required registers, etc.) to advantageously facilitate use of one or more host interface components 508 (e.g., MultiMediaCard (MMC), Universal Serial Bus (USB), and/or any other standard interface) to access flash devices. In further non-limiting embodiments, the flash controller system 500 can included a processor subsystem 510 (e.g., ARM7TDMI functionality or the like), embedded or otherwise, to facilitate overall interface data transfer control and management. The processor subsystem 510 can execute embedded firmware that can provide algorithms and functions of the flash controller system 500. In addition, the flash controller system 500 can include AHB bus infrastructure 512 to facilitate efficient data transfer between the various components of the flash controller system 500. In accordance with another embodiment, the flash controller system 500 can support a DMA Interface to the AHB bus (not shown), such as by including, for example, DMA controller functionality (not shown) within the flash controller system 500 or communicatively coupled thereto.

While various embodiments, components, and functionality are illustrated in particular numbers or configurations in the context of the description of flash controller system 500 (as well as other systems described herein) and the further embodiments more fully described herein, one having ordinary skill in the art would recognize that various modifications could be made without departing from the spirit of the disclosed subject innovation. For example, although for purposes of illustration, the provided techniques are more fully described herein regarding NAND flash applications and related components and/or operations, one skilled in the art will recognize that similar techniques can be applied to similar benefit in other flash applications (e.g., NOR flash, ORNAND, etc.) by making suitable modifications. For example, the provided techniques can be implemented in NOR flash applications by replacing the disclosed NAND flash interface with a NOR flash interface. In other instances, various disclosed techniques can be used with other non-flash memory technologies (e.g., DRAM, etc.).

In addition, it should be understood that while various components and functionality are illustrated as discrete blocks either in combination with or separate from other components and functionality, one having ordinary skill in the art would recognize that various levels of integration or separation of components and functionality may be accomplished according to known techniques and according to system design considerations. Thus, it should be understood that the description herein is but one of many embodiments that may be possible while keeping within the scope of the claims appended hereto.

Figure 6:
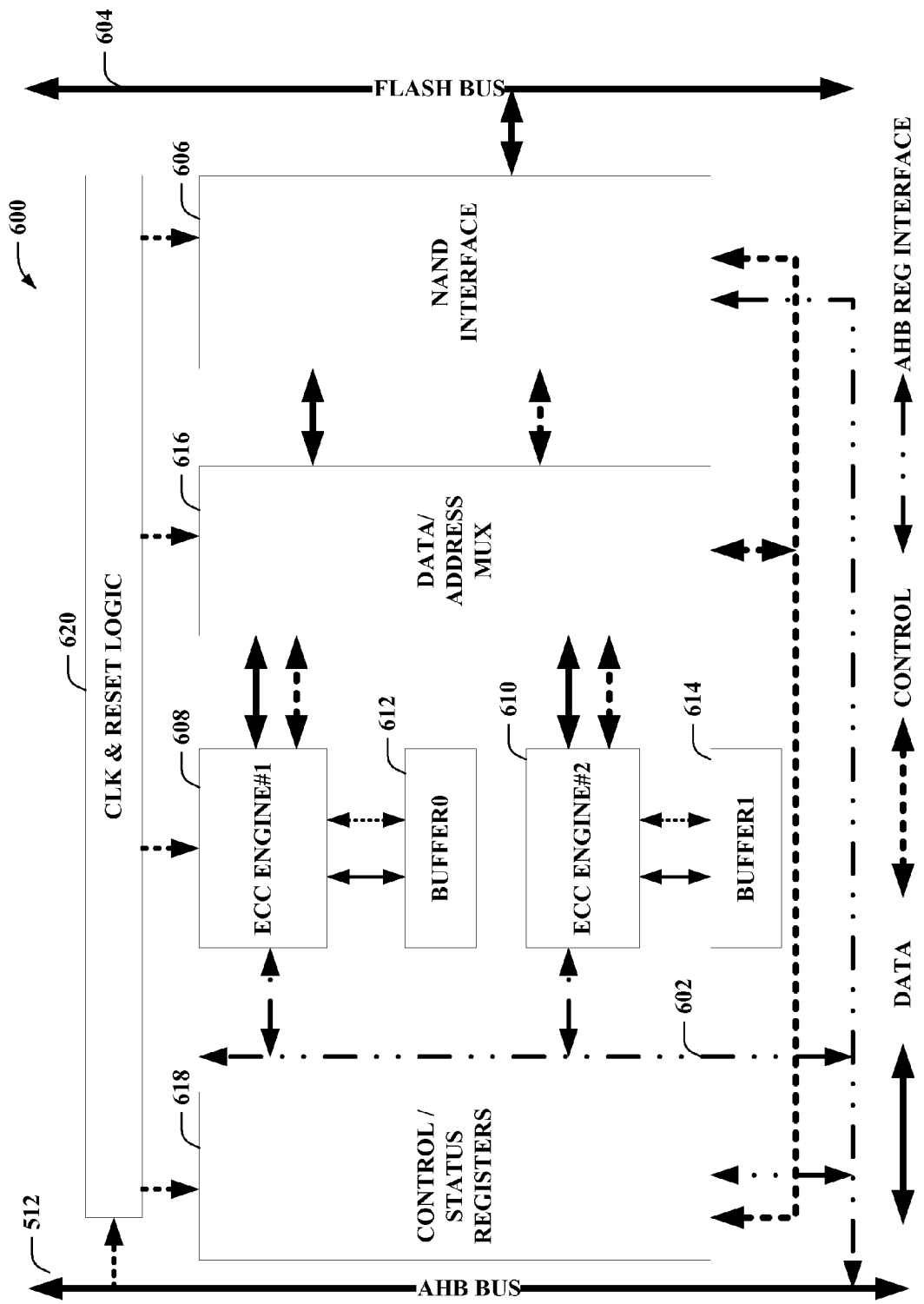
FIG. 6 illustrates an exemplary non-limiting block diagram of a flash channel interface in accordance with various aspects of the subject innovation.

FIG. 6 illustrates an exemplary non-limiting block diagram of a FCI 600 in accordance with various aspects of the disclosed subject matter. According to various non-limiting embodiments of the subject innovation, the FCI 600 provides virtually all the functions to directly access the NAND flash, to buffer the data, and to perform ECC encoding and decoding for data correction as the data moves into and out of the flash back into the external systems. For example, the provided FCI techniques can provide functions including, but not limited to, interface and control, timing and error correction for external flash chips (not shown), and other per channel features as desired, such as additional EDC/ECC or checksum requirements, and/or the like, and any combination thereof. In addition, the FCI 600 facilitates interfacing to internal AHB bus segment 602 and is responsible for transferring data between external flash (e.g., via flash bus 604) and controller system 500 (e.g., via AHB bus 512). FCI 600 facilitates communication between FCI and other of the flash controller systems components as well via AHB interfaces as more fully described herein, for example, with respect to system 500 and system 600.

As described above, conventional ECC techniques (e.g., schemes that read out the data from flash then perform ECC functions on the data) can take a substantial amount of time to conduct in flash memory operations. Moreover, as flash memory ages, the number of errors for which error correction is required can increase, further exacerbating the problem. According to various non-limiting embodiments of the subject innovation, substantially real-time error correction can be performed through the provided techniques. For example, as bit error rate goes up with flash memory age, the overall throughput of the system can be maintained or the detriment minimized through the use of dual buffer and ECC engines as described herein.

In addition, because NAND flash can typically take 25 microseconds to 1000's of microseconds to perform an operation, the provided flash channel interface, or portions thereof (e.g., a NAND flash interface (NFI)), can interleave data such that the throughput can be further improved by performing multiple operations on the flash devices almost concurrently, according to various aspects described herein. For example, while the FCI is waiting on a pending NAND flash operation, another capable flash device can be triggered to perform an operation such that flash operations can be performed in parallel. Moreover, such functions can be managed by the FCI through CPU 510 instructions received over the AHB bus 512.

According to various embodiments of the subject innovation, the FCI 600 can comprise NAND interface 606 to facilitate the functions described herein. In addition, the FCI 600 can include a plurality of ECC engines (e.g., 608 and 610) and buffers (e.g., 612 and 614) to facilitate high speed flash operations while maintaining data integrity through error detection and correction. For example, by incorporating a plurality of data buffers and ECC engines (e.g., 608 and 610) in a common hardware block with the NAND interface (NI) 610 and/or 614, data that is received from the flash device on a read operation and is transferred into the data buffers (e.g., 612 and 614) can be corrected by the ECC engines (e.g., 608 and 610) substantially in real-time (e.g., bad bytes can be analyzed as it is coming into the data buffers for error correction) to rapidly ensure data integrity, rather than reading out the data from flash then performing error detection and correction functions on the data. In a particular embodiment using two buffers (e.g., 612 and 614), only one buffer is to be read or written at a time, for which the addressing and control between the AHB bus and the ECC bus can be switched via multiplexer 616.

As a result, the provided ECC functionality facilitates on-the-fly error detection and correction, which can complement any additional ECC functionality provided on the flash device. In addition, the FCI 600 can include both write and read data paths with error detection and correction (e.g., BCH Error detection and correction logic, etc.), according to various embodiments of the disclosed subject matter. For example, the Write Data Path can generate the redundancy to support the BCH algorithm, and the Read Data path can recover the data and correct errors as the data is read from the flash memory. In a particular non-limiting embodiment, the FCI 600 can implement two buffers (e.g., 612 and 614), which can have a predetermined storage size (e.g., 542 bytes), and which can be implemented by single port RAM blocks, each with two interfaces (e.g., to support an AHB bus interface and a flash bus interface indicated as a control and data interface in FIG. 6). As a further example, the buffers (e.g., 612 and 614) can be 1088 bytes (1024 data+64 bytes of metadata) in size. Furthermore, each buffer (e.g., 612 and 614) can be accessible via the AHB bus 602 in separate memory mapped locations to facilitate read/write data to/from the flash devices (not shown).

Accordingly, the provided ECC functionality can facilitate transfer of data to/from the NI 606 and the data buffers (e.g., 612 and 614), detection and if possible, correction of errors on data read from the NI 606 (e.g., decode operation), and calculation of ECC bytes for storage into the NAND memory (e.g., an encode operation). For example, when the ECC (e.g., 608 and 610) transfers user data from the buffers (e.g., 612 and 614) to the NI 606 and ECC is not in Bypass mode, the ECC (e.g., 608 and 610) encodes the ECC redundant bytes and sends these to NI 606 (e.g., at the end of the user data). In addition, these ECC bytes can also be written back to the buffer at the same time. As a further example, when the ECC (e.g., 608 and 610) transfers data from the NI 606 to the buffers (e.g., 612 and 614), it can write the entire data block including the ECC redundant bytes to the respective buffer (e.g., 612 or 614). If the ECC is not in bypass mode, the respective ECC (e.g., 608 or 610) can proceed to correct the erroneous bytes in the buffer (e.g., 612 or 614), during a read operation. In a particular embodiment, if there are too many errors to correct, the ECC (e.g., 608 or 610) can leave the data in its raw form in the buffer and set an error flag in an ECC Status Register (e.g. in 618).

According to various non-limiting embodiments, the disclosed subject matter can facilitate control of the plurality of buffers (e.g., 612 and 614) by providing interface and control for data movement between the AHB bus 602 and the ECC engines (e.g., 608 and 610) and the NI 606. In a particular embodiment of the subject innovation, the buffer control can automatically select which buffer/ECC engine pair will be connected to the NI 606 via a mux 616. For example, data being written to flash via NI 606 can be written to one of the buffer memories (e.g., 612 or 614) first. An associated one of the ECC engines (e.g., 608 or 610) can then read the data from the respective buffer (e.g., when ECC is not in bypass mode), insert the ECC correction bytes and transfer the data to the NI 606 (e.g., 8 or 16 bits at a time). In various non-limiting embodiments, buffer control features can be programmed via the AHB accessible registers 618 to accomplish flash operations. For example, in the case of a flash write operation the buffer control can be programmed with information such as direction of data flow, size of block being transferred, and width of data words. In the exemplary case of a flash read, similar configurations can be made but with data movement occurring from the NI 606 through the ECC block (e.g., 608 and/or 610) for data correction, then to the buffer memory (e.g., 612 and/or 614). Once in buffer memory (e.g., 612 and 614), the AHB bus 602 can transfer data in the memory mapped buffer memory. In addition, DMA hand shake capability (not shown) can be provided to the buffer control so that data can be moved to/from the buffer memory under AHB DMA master control.

According to further non-limiting embodiments of the subject innovation, the FCI 600 can include control/status registers 618 and a data/address mux component 616, as well as other clock and reset logic components 620. For example control and status registers can be provided to facilitate control (e.g., CPU 510 control) of the various functions associated with each sub block in the FCI 600. In addition, the FCI 600 supports a Direct Memory Access (DMA) Interface (not shown) to the AHB bus, as described herein.

The following sections provide additional details regarding particular non-limiting embodiments of the components and functionality of FCI 600 for the purpose of illustration and not limitation. Thus, it is to be appreciated that the description herein is but one of many embodiments that may be possible while keeping within the scope of the claims appended hereto.

In particular embodiments, NI 606 can facilitate communication between Data/Address mux 616, ECC engines (608, 610), buffers (612, 614) and one or more external flash devices (not shown). NI 606 can provide a highly configurable and programmable (e.g., via the AHB bus) interface with various types of external flash, according to various aspects of the disclosed subject matter. For example, once a multi-byte transfer is initiated (e.g., a page read or page write), data transfers can take place directly between NI 606 and the ECC engine 1 (608) or 2 (610) and the associated buffer memory (612, 614). As a further example, processor subsystem 510 can program parameters (e.g., one or more bits) in NI 606 control registers 618 and initiate Read from Flash or Flash programming operations. Data/Address mux logic 616 can control the data flow from NI 606 to the plurality of ECC engines (e.g., 608, 610) and buffers (e.g., 612, 614) during Flash Read operation and can control data flow from buffers (e.g., 612, 614) and two (or more) ECC engines (e.g., 608, 610) to NI 606 during Flash Write operation. In addition, control/status register module 618 can facilitate control of the data flow between, a plurality of ECC engines (e.g., to ECC engines 608, 610) and NI 606, as well as including status registers to reflect state of data flow in FCI 600 according to further non-limiting embodiments of the subject innovation. FCI 600 can instantiate a plurality of instances of ECC engines (e.g., 608, 610) to ensure maximum data throughput from the system. In a particular embodiment, the FCI 600 can instantiate two instances of ECC engines (e.g., 608, 610), which can include the ECC logic to facilitate performing Error Detection and Correction based on a BCH algorithm.

In particular embodiments of the subject innovation, ECC logic can have a number of features demonstrating some aspects of the flexibility of the provided techniques. For example, the ECC logic can specify a fixed data sector size (e.g., 512+Spare bytes), of which the number of spare bytes can be programmable in a Data Format Register (DFR) register in ECC logic, and in which all correction/detection and generation of ECC redundant bytes can take place on the entire (e.g., 512 bytes+Spare bytes) data block. As an example, if the user data size is 512 bytes, 512 data bytes+7 spare+25 ECC redundant bytes results in a data block size of 544 bytes. As will be appreciated, the size of the useable data bytes will depend on the correction mode used, which in turn can specify the number of bits used for error detection and correction. According to further aspects of the subject innovation, the provided ECC engine can include both and encoder and a decoder in a single block, and which can operate on 16 bit data words. Furthermore, the ECC can implement multiple modes of operation (e.g., two modes of correction where two ECC engines are instantiated), the modes of which can selectable by a firmware configurable register (e.g., an ECC Control Register (ECR)).

In addition, the ECC logic can include an interface to NI 606 and an interface to buffers (e.g., 612 and 614). The interface to NI 606 can perform handshake operations, for example using signals such as "OKtoReceive" and "OKtoSend" signals. In a similar fashion, the interface to buffers (e.g., 612 and 614) can perform handshake operation, for example using signals such as "buff_full" and "buff_empty" signals for the respective buffer. In various embodiments of the subject innovation, the ECC interface can perform Reads from buffer (e.g., 612 and 614) and can perform writes to NI 606 during Flash Write transaction and Reads from NI 606 and writes to buffer (e.g., 612 and 614) during Flash Read transactions.

Figure 7:
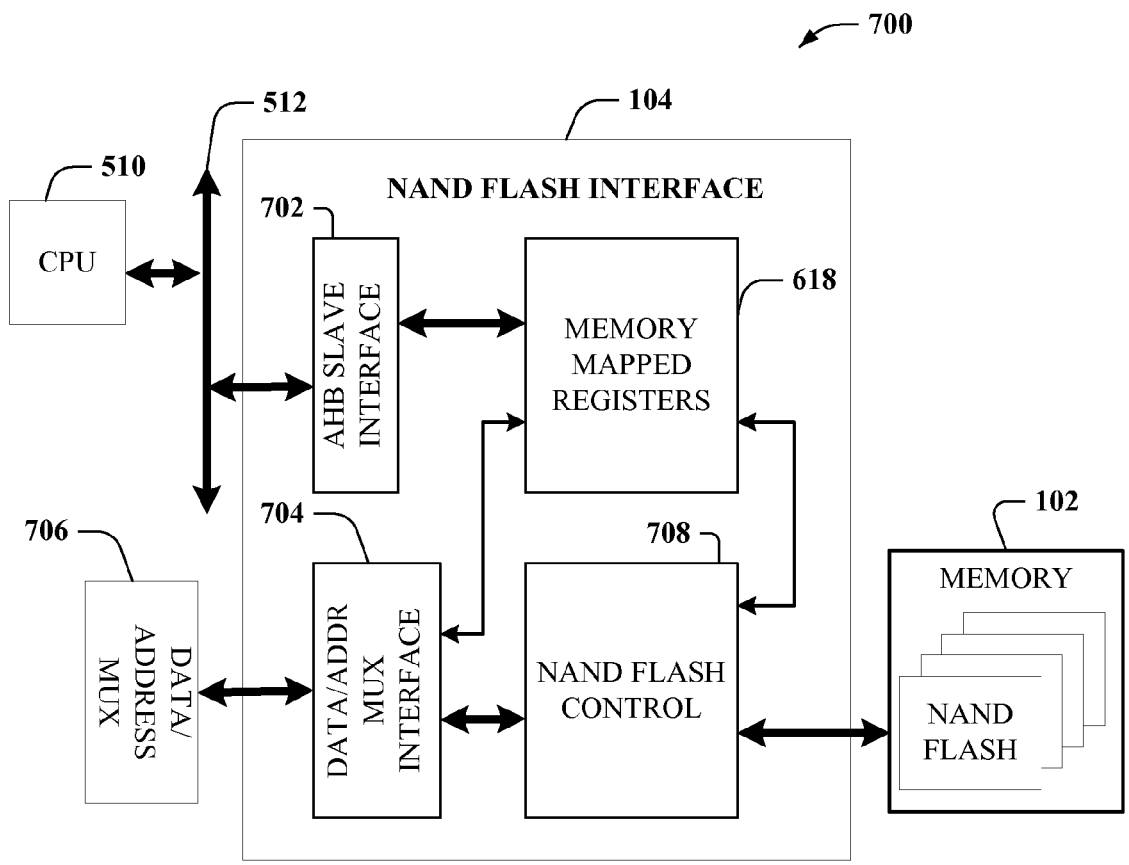
FIG. 7 depicts an exemplary high-level block diagram of a flash channel interface in accordance with various aspects of the disclosed subject matter.

FIG. 7 depicts an exemplary high-level block diagram of a NAND flash interface (NFI) system 700 in accordance with further aspects of the disclosed subject matter. According to various non-limiting embodiments, the NFI system 700 can comprise a NFI 104 which can include an AHB Slave Interface 702, which can in turn facilitate access to memory mapped registers 618 in NFI 700, in order to configure, control and monitor operations of NFI system 700. Among other functions, AHB Slave Interface 702 can provide an AHB interface to NFI 104, to Control/status register block 618, and to ECC engines (not shown). In addition, AHB transfers from/to DMA and CPU block 510 with NFI 700 is carried out through the AHB Slave Interface 702.

In a particular non-limiting embodiment, the AHB slave interface 702 can substantially conform to AMBA AHB Specification (e.g., Rev2.0 or later of the AHB Specification). In addition, the AHB slave interface 702 can facilitate programming the NFI 104 for various purposes as described herein. For example, the AHB slave interface 702 can facilitate configuring the programmable NAND access timing feature of the provided NFI 104. In another example, when a "Read Status" command is sent to a flash device, the returned status can be latched into a register (e.g., a Flash Status Data Register (FSDR)), which can be read by a CPU 510 through this interface. Memory Mapped Registers 618 can include all registers, or substantially all registers, desired to provide instructions and parameters for operations of NFI 700 to memory 102 (e.g., one or more associated NAND flash memory devices).

According to further non-limiting embodiments, the NFI 700 can interface 704 to external ECC modules (not shown) through Data/Address MUX Block 706. For example, data for Read operation, Program operation, Read ID and parameter information can all transfer through this interface 704. Additionally, NAND Flash Control 708 can be used to provide timing control signals to memory 102, according to various aspects of the disclosed subject matter. In addition, the NFI 104 can facilitate interrupt based handshake with CPU 510.

Figure 8:
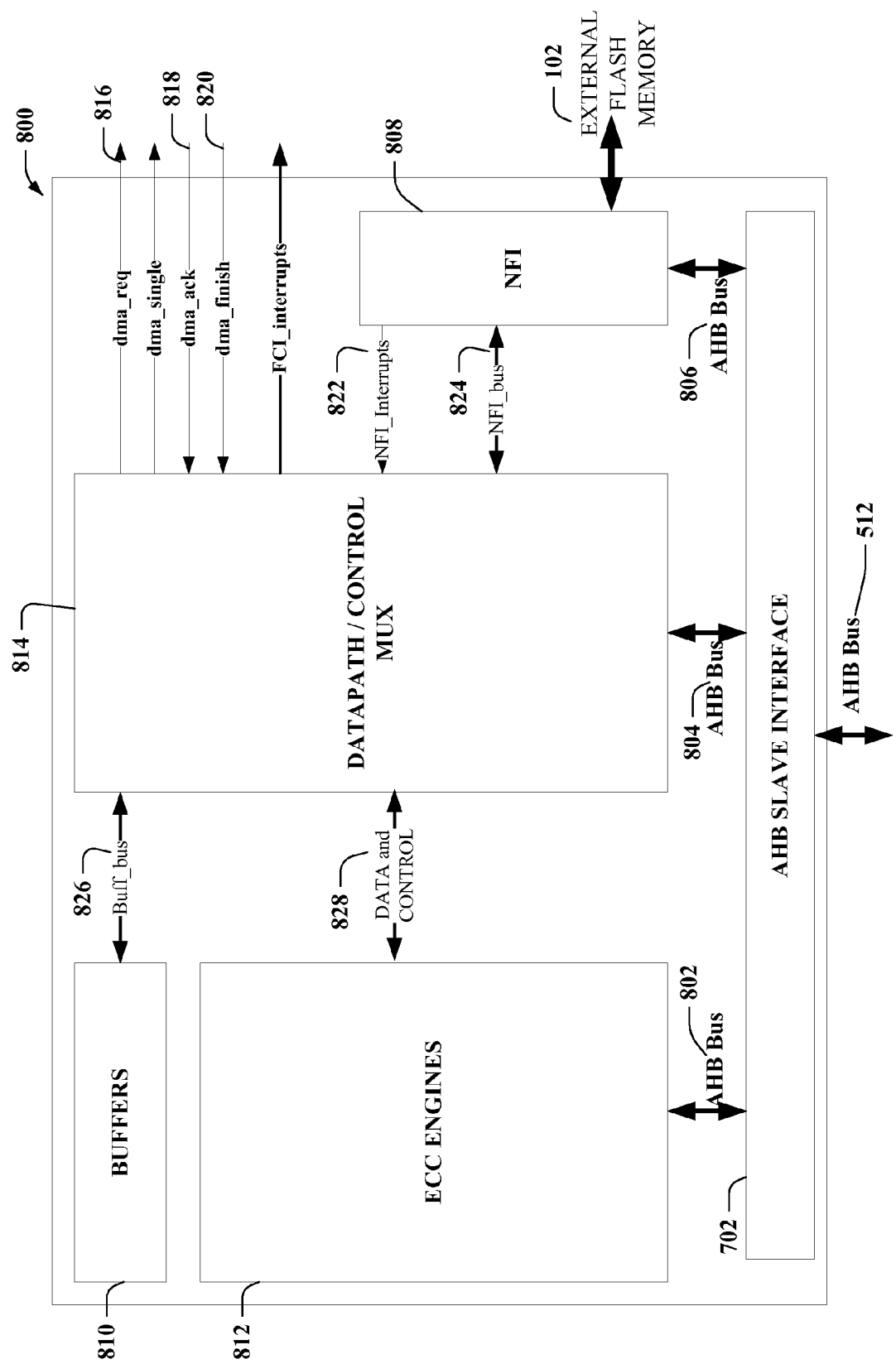
FIG. 8 illustrates an exemplary non-limiting block diagram of a flash channel interface in accordance with further aspects of the subject innovation.

FIG. 8 illustrates an exemplary non-limiting block diagram of a flash channel interface 800 in accordance with further aspects of the disclosed subject matter. In accordance with various embodiments, the subject innovation can provide an interface 800 between a microcontroller internal bus (e.g., AHB bus 802-806) and the external flash memory 102 through the NAND flash interface (NFI) sub-block 808. For example, the FCI can include substantially all functions to facilitate direct access to the memory 102, to buffer the data at 810, and to perform ECC encoding and decoding at 812 for data correction as the data moves from the flash 102 back into the host system. It should be appreciated that, while buffers 810 and ECC engines 812 are illustrated as singular blocks for simplicity of illustration, the subject innovation is not so limited as described supra.

As described above, conventional error detection and correction can take a substantial amount of time to conduct for flash memory operations. Moreover, as flash memory ages, the number of errors for which error correction is required can increase, further exacerbating the problem. By incorporating a plurality of data buffers and ECC engines, the problem of increasing bit errors can be mitigated to maintain high-speed flash memory operations as flash memory ages. For example, FCI 800 can include a plurality of data buffers 810 and ECC engines 812 in the same hardware block as the NFI sub-block 808 to advantageously facilitate extremely fast (e.g., substantially real-time) analysis and error correction to ensure data integrity. As a further example, as the data is received from the memory 102 on a read operation and is transferred into the data buffers 810, the data can be quickly analyzed and errors can be detected and corrected by the ECC engines 812 (e.g., bad bytes can be analyzed substantially in real time as data is transferred into the data buffers 810 for error correction). It should be appreciated that although various types of ECC can be employed (e.g., Reed Solomon, Hamming, Trellis Encoding with BCH engine, etc.) as data is written to and read from the flash memory, in various embodiments of the subject innovation BCH ECC techniques can be used to facilitate error detection and correction.

Moreover, according to various embodiments of the subject innovation, the FCI 800 can advantageously facilitate switchable ECC modes from single to multiple (e.g., dual) ECC mode (e.g., using a control bit), in addition to enabling or disabling (e.g., ECC bypass mode in which data can be transferred to from NFI 808 directly from buffers 810) error detection and correction, to further mitigate throughput losses caused by increased bit error rate as the flash ages.

In addition, because NAND flash can take from about 25 microseconds to 1000's of microseconds to perform a requested operation, the NFI 808 can advantageously facilitate interleaving data such that the throughput can be further improved by performing multiple operations almost concurrently on the separate flash devices in the flash memory 102 or portions thereof. For example, while the FCI 800 is waiting on a pending NAND flash operation, the FCI 800 can facilitate triggering another capable flash device in memory 102 to perform an operation to be managed by the FCI 800 through CPU 510 instructions received over the AHB bus (802-806).

According to various embodiments of the disclosed subject matter, when writing to flash from the system, data can be delivered (e.g., in blocks of 512 bytes, 1024 bytes, etc.) through the AHB bus 804, though the interface 702, can then be encoded with error correction information, prior to being transferred through the NFI 808, to the memory 102. It should be appreciated that the size of the data as stored on the flash memory 102 can increase as a result of adding ECC information to the data, which can be automatically performed by the ECC engines 812 and related FCI hardware.

To that end, according to various non-limiting embodiments of the subject innovation, one or more of the following registers 618, and/or additional registers, can be provided and configured or read to facilitate enabling ECC, disabling ECC, specifying an ECC mode, and/or storing and obtaining status of ECC operations associated with FCI 800: an ECC Enable Register (EER); an ECC Control Register (ECR); an ECC Data Format Register (DFR); and an ECC Status Register (ESR). For instance, EER can facilitate enabling one or more ECC engines 812 to start ECC error detection and/or correction. Additionally, DFR can indicate a total protected data block size in number of bytes to be operated on with a particular mode of ECC enabled. For instance, if the user data size is 512 bytes, 512 data bytes+7 spare+25 ECC redundant bytes results in a total protected data block size of 544 bytes. Thus, the number of bytes to be read or written can be specified in an ECC DFR.

In addition, ECR can facilitate specifying whether or not ECC is bypassed, or whether data is encoded (or decoded) when writing to (or reading from) NFI 808, in addition to specifying various ECC related parameters (e.g., number of redundant bytes, or other EEC mode related parameters). For instance, ECR can facilitate controlling whether or not ECC engines 812 perform detection and correction activities as the data passes through. As an example, ECC can be bypassed such that no error correction and/or detection is performed during reads or writes. Thus, ECC engines 812 can operate as data movement engines between buffers 810 and NFI 808. For instance, during reads from NFI 808 in bypass mode, bytes read from NFI 808 can be written to buffers 810. During writes to the NFI 808 in bypass mode, bytes written to NFI 808 can come from buffers 810. When not in bypass mode, ECC can encode data from buffers 810 when writing to NFI 808 and can decode data in buffers 810 when reading from NFI 808.

Additionally, ESR can facilitate storing and obtaining status of ECC operations associated with FCI 800. For example, during a read operation, ESR can indicate whether all data has been transferred from NFI 808 to buffers 810 and corrected data has been written back into buffers 810. During a write to NFI 808, ESR can indicate when all data has been written to NFI 808 and ECC redundant bytes have been written back to buffer 810. Additionally, ESR can facilitate indicating whether detection of errors is complete, whether correctable errors have been corrected, whether ECC was unable to correct errors, whether ECC is busy (e.g., ECC is in the process of encoding, decoding or correcting bytes), and how many bit errors have been found and need to be corrected, for example.

It should be appreciated that the techniques according to the subject innovation as described herein can be provided in one or more packages, in part of or all of one die, in multiple dice, or in any combination thereof and can further be incorporated into part of a larger logic device (e.g., a flash controller system as described supra or otherwise) or part of a larger package providing supplementary or ancillary functions including but not limited to flash devices or other flash microcontroller functions, and the like or any combination thereof. For example, in a particular non-limiting embodiment, the FCI 800 can be provided as part of an overall flash microcontroller system 500 as described supra in connection with FIG. 5, on a separate die from the NAND flash devices, capable of being set either in a separate package or in other die in the same package, and capable of speaking to up to eight flash dice.

In addition, according to various embodiments of the subject innovation, the FCI 800 can facilitate a hardware handshaking DMA Interface (as depicted by 828-832). For example, the CPU 510 can access the registers 618 residing in the FCI 800 to facilitate providing the DMA interface, which can include both write and read data paths with BCH Error correction and detection logic, according to various aspects of the disclosed subject matter. As a further example, the Write Data Path can generate the correction bits to support the BCH algorithm, while the Read Data path can recover the data and correct errors as the data is read from the memory 102. Accordingly, a dma_req path 816 can be provided to facilitate requesting a burst transfer to DMA, while a dma_ack path 818 can be provided to acknowledge a burst transfer request to be processed by a DMA engine not shown, in addition to a dma_finish path 820 for indicating that a DMA block transaction has been completed.

Additionally, FCI 800 can include a plurality of data and control interfaces 822-828 to facilitate various control and data transfer functions within FCI 800, as described above in connection with FIG. 6. For example, the FCI 800 can include an interface to NFI 808 and an interface to buffers 808. The interface to NFI 808 can facilitate handshake functions, for example using signals such as "OKtoReceive" and "OKtoSend" signals. In a similar fashion, an interface to buffers 808 can facilitate handshake functions, for example using signals such as "buff_full" and "buff_empty" signals for the respective buffer. In various embodiments of the subject innovation, the data and control interfaces can facilitate reads from buffers 808 and can facilitate writes to NFI 808 during flash write transactions and reads from NFI 808 and writes to buffer 808 during flash read transactions.

In addition, according to various non-limiting embodiments of the subject innovation, one or more of the following registers 618, and/or additional registers, can be provided and configured to facilitate construction and execution of specified command sequences to accomplish a flash memory access operations (e.g., memory programming/read operation), except read status operations: Command Register (CMDR); Data size Register (DSR); Column address Register (CAR); Row address Register (RAR); Micro-Operation Sequence Register (MOSRn); Write Timing Register (WTR); Read Timing Register (RTR); NFI Control Register (NFICR) a read/write register, which can be used to control NFI 808 to execute a command sequence and setup the enable property of interrupts. In addition, CMDR, MOSRn, and/or NFICR registers can be configured to facilitate NAND flash reset operations and read status operations.

According to various embodiments of the disclosed subject matter, a series of Micro-Operations can make up a Command Sequence, according to which, the NFI 808 can execute Micro-Operations one by one, in a specified sequence, in order to complete the Device Operation to memory 102 (e.g., Page Read, Page Program, Erase, and the like). To that end, a further aspect of the subject innovation can facilitate software set up of command sequences, which can be written to one or more Micro-Operation Sequence Registers (e.g., in 618). Accordingly, the following sections describe operations of FCI 800 facilitate software completion of a memory access operations according to various non-limiting embodiments of the subject innovation. Additional terminology used herein for the description of the operation of FCI 800 is as follows: as part of NFICR, Device Selection (DEV_SEL) can specify which one of a number of banks of memory 102 (e.g., banks of NAND flash devices) is to be selected for current command sequence, Interrupt Enable (INTGEN_EN) can be used to enable the interrupt to CPU 510, and Sequence Register Control (SEQ_CTRL) can specify how to form a command sequence to be executed by NFI with micro-operations specified by MOSRn; the Micro-operation Status Register (MSR), a read/write register, can be used to set up the status of micro-operations (e.g., this register can indicate completion of the command sequence as defined by a prepared micro-operation sequence, or whether the NFI 808 is busy executing a command sequence); and FSDRn, a set of read only registers, can be used to contain status data read from status register of the respective NAND devices.

As a result of the flexibility of FCI 800, the NFI sub-block 808 can facilitate flash operations according to ONFI 1.0 standard, in addition to facilitating operations that are backwards compatible with other legacy (e.g., ONFI 1.0 non-conforming devices) flash devices. To that end, the NFI techniques can be implemented as a flexible, programmable micro-code engine, where the operations to be performed on a flash (e.g., a write operations) can be broken into micro-operations (e.g., commands, addresses, and/or other desired parameters) and sent to the FCI 800, for storage, reassembly, and execution by NFI 808, which can then communicate with the particular flash device 102. Accordingly, NFI 808 can start to perform read or write cycles to memory 102 according to the specified configuration and order of micro-operations as stored in the respective Micro-Operation Sequence Register after CPU 510 sets a "GO" bit. After software executing on CPU 510 sets the "GO" bit, the NFI 808 can analyze the command sequence, and then execute micro-operations one by one, stopping for instance when an end of sequence (EOS) in the command sequence is encountered, when all commands have been executed, or when a software reset command is received. According to a further aspect of the disclosed subject matter, if a send data (TXD) or read data (RXD) micro-operation is encountered in the command sequence, data transfer will take place between the NFI 808 and Data/Address MUX 814 while TXD or RXD is executing.

For example, a Spansion® flash device can have a slightly different command set than a flash device of another manufacturer. Accordingly, the subject innovation advantageously provides the flexibility to perform flash operations on different flash devices having different characteristics (e.g., command sets, timing, etc.) by providing software modifications facilitated at the controller level, which can facilitate generating the command sequence from supported micro-operations. It should be appreciated that depending on the nature of revisions to the ONFI standard, the disclosed techniques can additionally provide the potential flexibility to accommodate such revisions with a software upgrade, for example.

In accordance with an aspect of the disclosed subject matter, micro-operations can indicate the operation phases the NFI 808 is to take, which can define and store in Micro-Operation Sequence Registers the sequence of operation phases that NAND flash interface 808 will execute, as described in more detail herein. The NFI 808 can wait for the memory 102 to finish and read status information therefrom. The aforementioned systems and interface techniques have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, can be provided to communicatively couple to such sub-components in order to provide integrated functionality. Any components described herein can also interact with one or more other components not specifically described herein but generally known by those of skill in the art.

Figure 9:
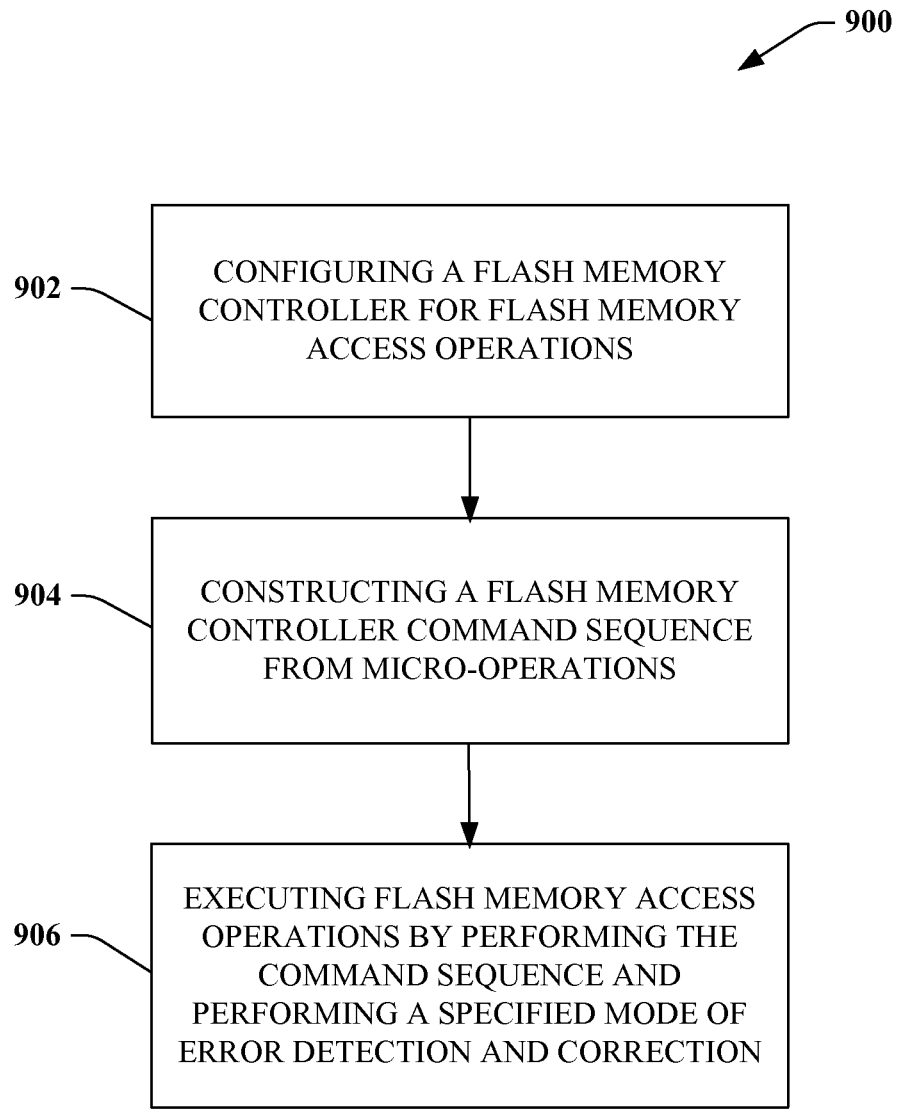
FIG. 9 depicts an exemplary high-level methodology that facilitates flash memory access in accordance with various aspects of the subject innovation.

In view of the exemplary systems described supra, methodologies that can be implemented in accordance with the disclosed subject matter will be better appreciated with reference to the flowcharts of FIGS. 9-11. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, can be implemented which achieve the same or a similar result. Moreover, not all illustrated blocks may be required to implement the methodologies described hereinafter.

FIG. 9 depicts an exemplary high-level methodology 900 that facilitates flash memory access in accordance with various aspects of the disclosed subject matter. At 902, a flash memory controller can be configured to facilitate flash memory access operations. For example, flash memory timings can be configured in the controller to provide support for specific memory devices. In various embodiments, the methodology 900 can include writing appropriate values to WTR and RTR to configure flash memory timing in a flash controller.

At 904, a flash memory controller command sequence can be constructed. For instance, the command sequence can be constructed from supported micro-operations, where micro-operations are supported by particular flash memory, and which can be selected for flash memory access by the controller. For example, in accordance with various embodiments, supported micro-operations can be selected and stored in one or more micro-operation sequence registers of a flash controller, in addition to storing micro-operation sequence information, according to which the sequence of micro-operations can be specified to facilitate flash memory access by the flash controller. Additionally, the methodology 900 can include storing the command sequence in a command register associated with the flash controller based in part on the micro-operations stored in the micro-operation sequence registers. For example, the methodology 900 can include configuring a CMDR. As a further example, a desired sequence of micro-operations can be specified in a sequence register control (e.g., SEQ_CTRL) to facilitate indicating how to form a command sequence from the micro-operations stored in micro-operation sequence registers (e.g., MOSRn). In addition, a flash memory device selection, a data size, a column address, and/or a row address can be indicated in the flash controller based in part on the command sequence to facilitate indication, for data of interest, the desired parameters to facilitate flash memory access. As an example, the parameters can be indicated by configuring for the flash controller a flash memory device select indicator (e.g., a DEV_SEL indicator in NFICR), a data size register (e.g., a DSR), a column address register (e.g. a CAR), and a row address register (e.g., a RAR), according to the command sequence.

At 906, the one or more flash memory access operations can be executed. For instance, the command sequence can be performed to facilitate flash memory access operations. For example, CPU 510 can set a "GO" bit, thereby starting the execution of the command sequence. As a result, the execution of the micro-operations in a specified sequence can be conducted by NFI 808 to accomplish the desired flash memory access operation. In addition, modes of error detection and correction can be specified and performed in the flash memory controller as the access operations are performed on the flash memory device. To that end, the methodology 900 can include error detection, error correction, and/or buffering on the data of interest. In one aspect, the methodology 900 can include specifying an error correction mode as more fully described supra. For example, error detection, error correction, and/or buffering can be performed in one or more of a plurality of buffer and error detection and correction engine sets (e.g., 810 and 812) of the flash controller, or the error detection and correction can be bypassed, as determined by CPU 510.

In addition, further embodiments of a methodology facilitating flash memory access can include determining an indication of the completion of flash memory access operations. For example, in such embodiments, an indication of flash memory access completion can be determined by waiting for NFI 808 to finish the command sequence and polling MSR or waiting for an interrupt to CPU 510. In a further non-limiting embodiment, if a read flash status (STA) micro-operation is encountered in the micro-operation sequence, software executing on CPU 510 can read FSDRn to get flash status data.

Figure 10A:
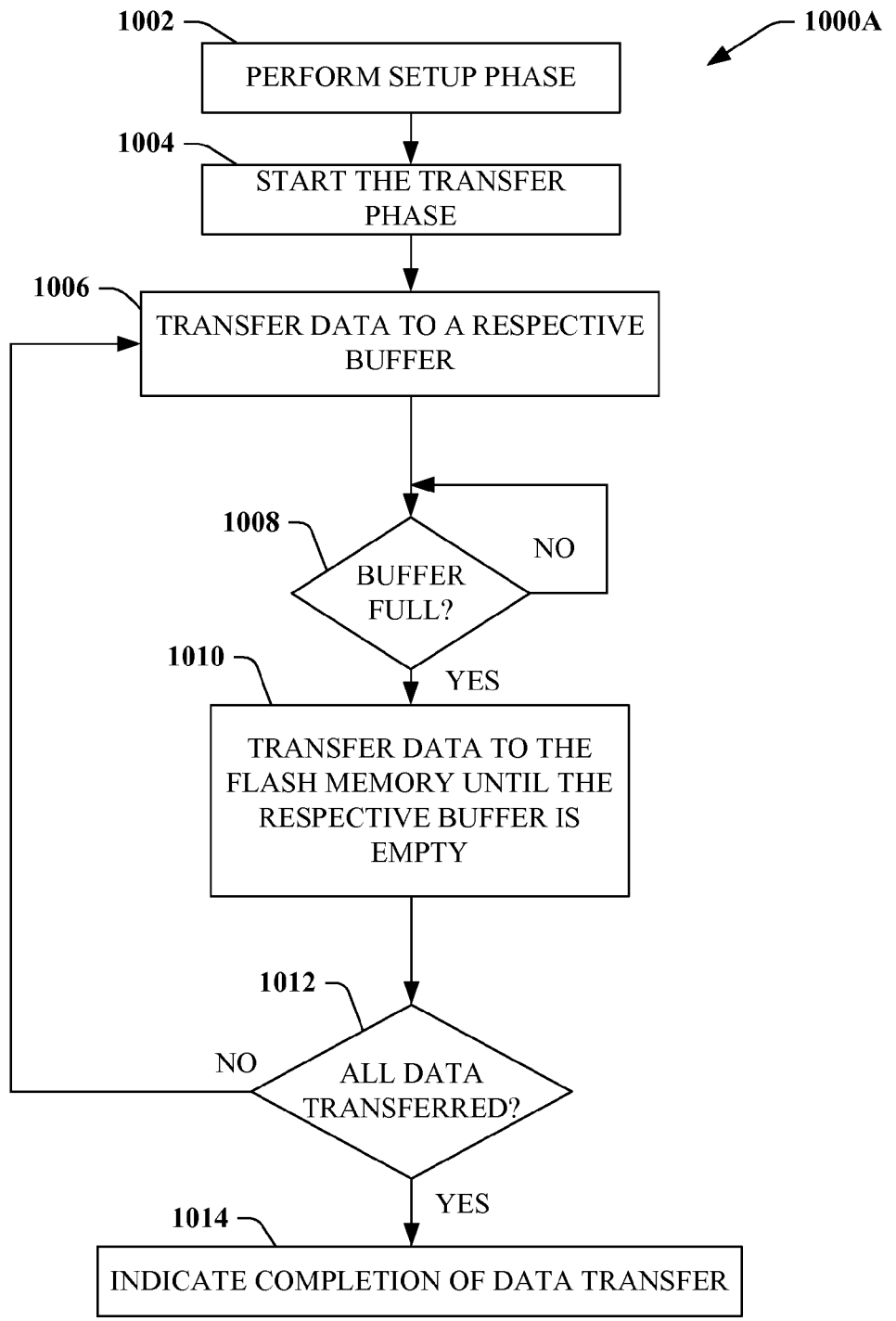
FIGS. 10A-10C illustrate exemplary non-limiting block diagrams of methodologies that facilitate flash write operations in accordance various embodiments of the subject matter disclosed herein.
Figure 10B:
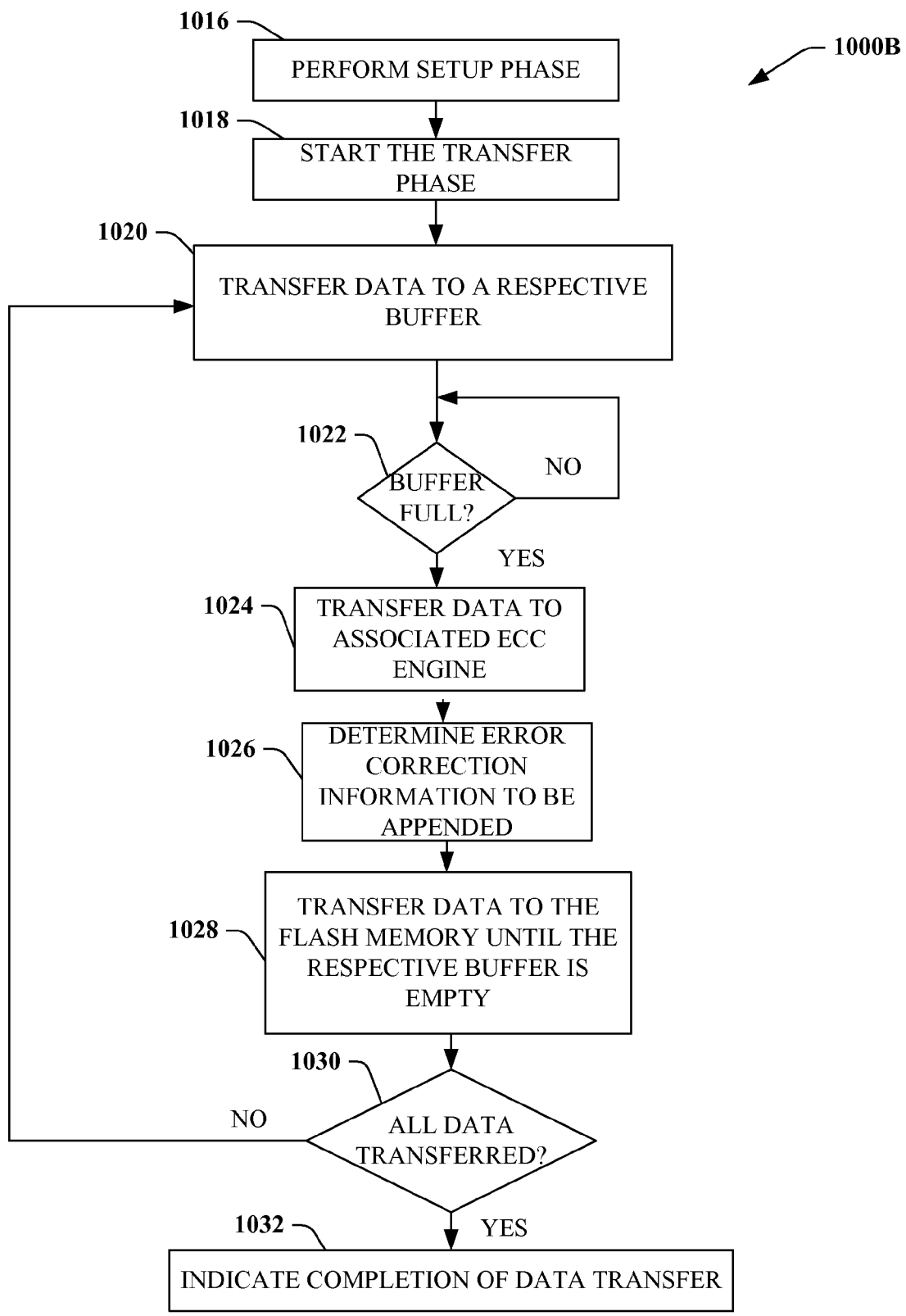
Figure 10C:
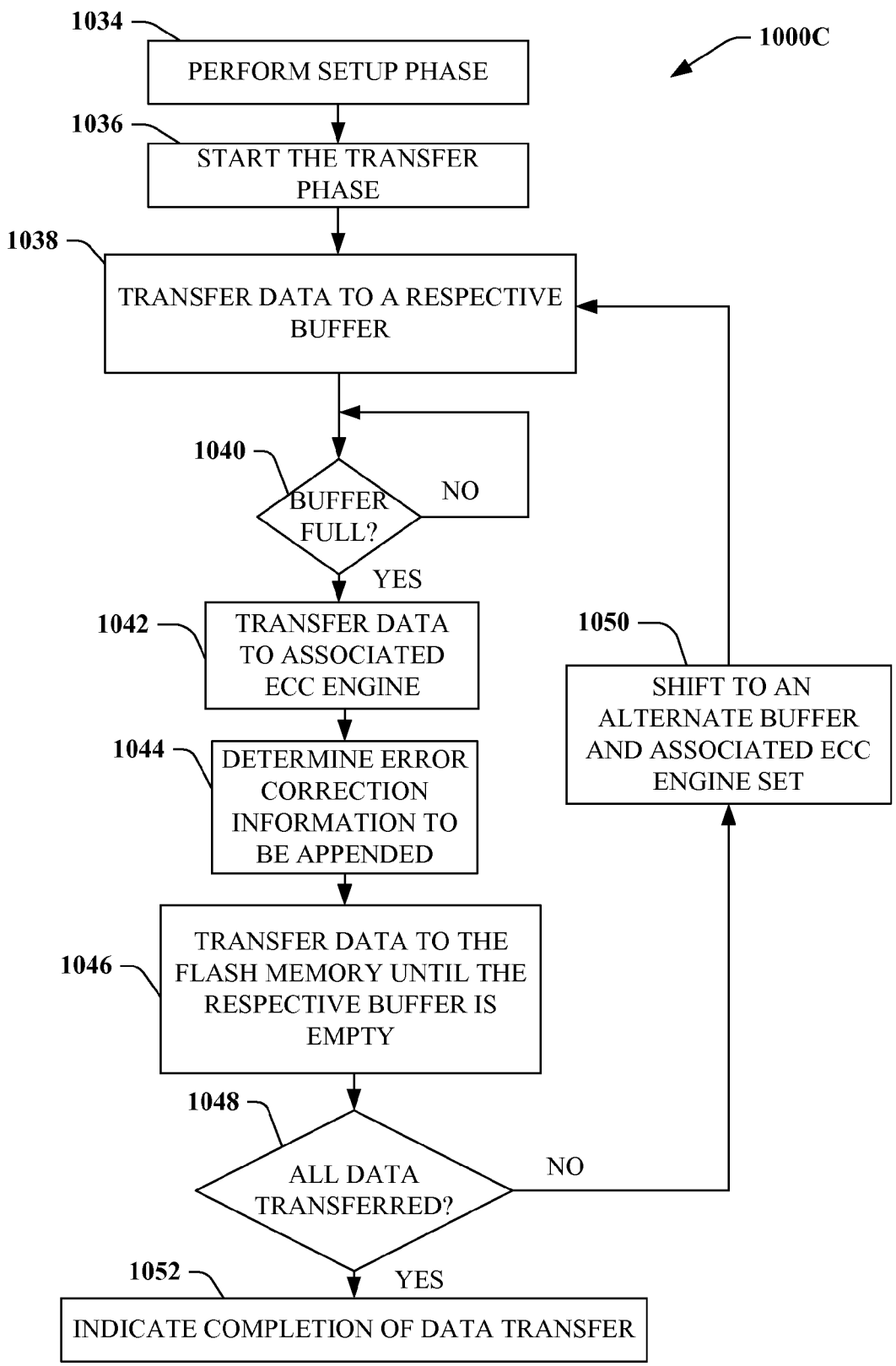

FIGS. 10A-10C illustrate exemplary non-limiting block diagrams of methodologies 1000A-1000C that can facilitate flash write operations in accordance various embodiments of the subject matter disclosed herein. The methodologies 1000A-1000C, or portions thereof, generally follow the process as described in connection with FIG. 9, in which software executing in CPU 510 directs data to be written to memory 102. The methodologies 1000A-1000C can be broadly described in terms of a setup phase (e.g., configuring and constructing acts of FIG. 9) and a transfer phase. While the methodologies 1000A-1000C refer to software performing certain functions, it is to be understood that software can be executing on a processor (e.g., CPU 510) for the purpose of carrying out the prescribed acts.

Referring to FIG. 10A, illustrated is an exemplary non-limiting block diagram of a methodology 1000A that can facilitate flash write operations with ECC bypassed in accordance with various embodiments of the subject matter disclosed herein. At 1002, a setup phase can be performed. For the example case where software executing in CPU 510 directs writing a page of data (e.g., 2048 bytes, 4096 bytes, etc.) to memory 102, the setup phase can include software configuring associated registers in the FCI 800 to communicate to the NFI 808 and ECC engines 812 the block size to be written. The setup phase can further include software providing commands to the NFI 808 for performing flash memory access operations on memory 102 (e.g., NAND flash memory), providing the flash memory addresses to be written to the NFI 808, providing timing parameters, and setting a variety of configuration cases (e.g., single or dual ECC mode, or bypass mode, in which no encoding will be performed). At 1004, the transfer phase can be started. For example, once the setup phase is complete and the system is ready to write the data, the methodologies 1000A-1000C can include software switching a "GO" bit to facilitate starting the transfer phase. At 1006, data is transferred to a respective buffer. For instance, the methodology 1000A can further include the DataPath/Control Mux 814 signaling for a DMA transfer of data across the AHB bus to facilitate data transfer to buffer 810.

At 1008, the data transfer to buffer 810 can continue until buffer 810 is full, and/or all data associated with a data transfer has been provided the buffer 810 (e.g., even though the buffer 810 is not completely filled). At 1010, the data can be transferred to flash memory 102, once buffer 810 is determined to be full (and/or all data has been transferred to the buffer 810) at 1008. For instance, the methodology 1000A can further include transferring data through the NFI 808 to the memory 102 (e.g., NAND flash memory) until respective buffer 810 is empty. At 1012, a determination can be made regarding whether all the data has been transferred. If it is determined that there is more data to be transferred, methodology 1000A can return to reference numeral 1006, where the process acts of filling (1006, 1008) and emptying (1010) buffer 810 can continue until all the blocks have been transferred. If, at 1012, it is determined that all data associated with the operation(s) has been transferred, at 1014, completion of the data transfer can be indicated. For example, the methodology 1000A can further include sending an interrupt from the NFI 808 to the CPU 510 indicating that the data has been sent to the flash. Alternatively, the methodology 1000A can include reading a flash status data register to get flash status data.

Referring to FIG. 10B, illustrated is an exemplary non-limiting block diagram of a methodology 1000B that can facilitate flash write operations in a single ECC mode in accordance with various embodiments of the subject matter disclosed herein. At 1016, a setup phase can be performed. For the example case where software executing in CPU 510 directs writing a page of data (e.g., 2048 bytes, 4096 bytes, etc.) to memory 102, the setup phase can include software configuring associated registers in the FCI 800 to communicate to the NFI 808 and ECC engines 812 the block size to be written. The setup phase can further include software providing commands to the NFI 808 for performing flash memory access operations on memory 102 (e.g., NAND flash memory), providing the flash memory addresses to be written to the NFI 808, providing timing parameters, and setting a variety of configuration cases (e.g., single or dual ECC mode, or bypass mode, in which no encoding will be performed).

At 1018, the transfer phase can be started. For example, once the setup phase is complete and the system is ready to write the data, the methodologies 1000A-1000C can include software switching a "GO" bit to facilitate starting the transfer phase. At 1020, data is transferred to a respective buffer. For instance, the methodology 1000B can further include the DataPath/Control Mux 814 signaling for a DMA transfer of data across the AHB bus to facilitate data transfer to buffer 810.

At 1022, the data transfer to buffer 810 can continue until buffer 810 is full, and/or all data associated with a data transfer has been provided the buffer 810 (e.g., even though the buffer 810 is not completely filled). At 1024, the data can be transferred to an associated ECC engine 812, once buffer 810 is determined to be full (and/or all data has been transferred to the buffer 810) at 1022. For instance, the methodology 1000B can further include the DataPath/Control Mux 814 automatically transferring the data to an associated ECC engine 812. At 1026, error correction information to be appended to the data is determined. For example, depending on the error detection and correction mode specified during setup phase, the methodology 1000B can include an associated ECC engine 812 determining error correction information to be appended to the data. At 1028, the data can be transferred to flash memory 102. For instance, the methodology 1000B can further include transferring data through the NFI 808 to the memory 102 (e.g., NAND flash memory) until respective buffer 810 is empty.

At 1030, a determination can be made regarding whether all the data has been transferred. If it is determined that there is more data to be transferred, methodology 1000B can return to reference numeral 1020, where the process acts of filling (1020, 1022) and emptying (1024-1028) buffer 810 can continue until all the blocks have been transferred. If, at 1030, it is determined that all data associated with the operation(s) has been transferred, at 1032, completion of the data transfer can be indicated. For example, the methodology 1000B can further include sending an interrupt from the NFI 808 to the CPU 510 indicating that the data has been sent to the flash. Alternatively, the methodology 1000B can include reading a flash status data register to get flash status data.

Referring to FIG. 10C, illustrated is an exemplary non-limiting block diagram of a methodology 1000C that can facilitate flash write operations in a dual ECC mode in accordance with various embodiments of the subject matter disclosed herein. At 1034, a setup phase can be performed. For the example case where software executing in CPU 510 directs writing a page of data (e.g., 2048 bytes, 4096 bytes, etc.) to memory 102, the setup phase can include software configuring associated registers in the FCI 800 to communicate to the NFI 808 and ECC engines 812 the block size to be written. The setup phase can further include software providing commands to the NFI 808 for performing flash memory access operations on memory 102 (e.g., NAND flash memory), providing the flash memory addresses to be written to the NFI 808, providing timing parameters, and setting a variety of configuration cases (e.g., single or dual ECC mode, or bypass mode, in which no encoding will be performed). At 1036, the transfer phase can be started. For example, once the setup phase is complete and the system is ready to write the data, the methodologies 1000A-1000C can include software switching a "GO" bit to facilitate starting the transfer phase. At 1038, data can be transferred to a respective buffer. For instance, the methodology 1000C can further include the DataPath/Control Mux 814 signaling for a DMA transfer of data across the AHB bus to facilitate data transfer to buffer 810.

At 1040, the data transfer to buffer 810 can continue until buffer 810 is full, and/or all data associated with a data transfer has been provided the buffer 810 (e.g., even though the buffer 810 is not completely filled). At 1042, the data can be transferred to an associated ECC engine 812, once buffer 810 is determined to be full (and/or all data has been transferred to the buffer 810) at 1040. For instance, the methodology 1000C can further include the DataPath/Control Mux 814 automatically transferring the data to an associated ECC engine 812. At 1044, error correction information to be appended is determined. For example, depending on the error detection and correction mode specified during setup phase, the methodology 1000C can include an associated ECC engine 812 determining error correction information to be appended to the data. At 1046, the data can be transferred to flash memory 102. For instance, the methodology 1000C can further include transferring data through the NFI 808 to the memory 102 (e.g., NAND flash memory) until respective buffer 810 is empty.

At 1048, a determination can be made regarding whether all the data has been transferred. If it is determined that there is more data to be transferred, at 1050, methodology 1000C can shift to an alternate set of buffer 810 and ECC engine 812 to continue transferring data. For example, if not all data has been transferred, the methodology 1000C can further include the DataPath/Control Mux 814 automatically shifting to an alternate set of buffer 810 ECC and associated engine 812, and methodology 1000C can return to reference numeral 1038, and methodology 1000C can proceed from that point. If, at 1048, it is determined that all data associated with the operation(s) has been transferred, at 1052, completion of the data transfer can be indicated. For example, the methodology 1000C can further include sending an interrupt from the NFI 808 to the CPU 510 indicating that the data has been sent to the flash. Alternatively, the methodology 1000C can include reading a flash status data register to get flash status data.

Figure 11A:
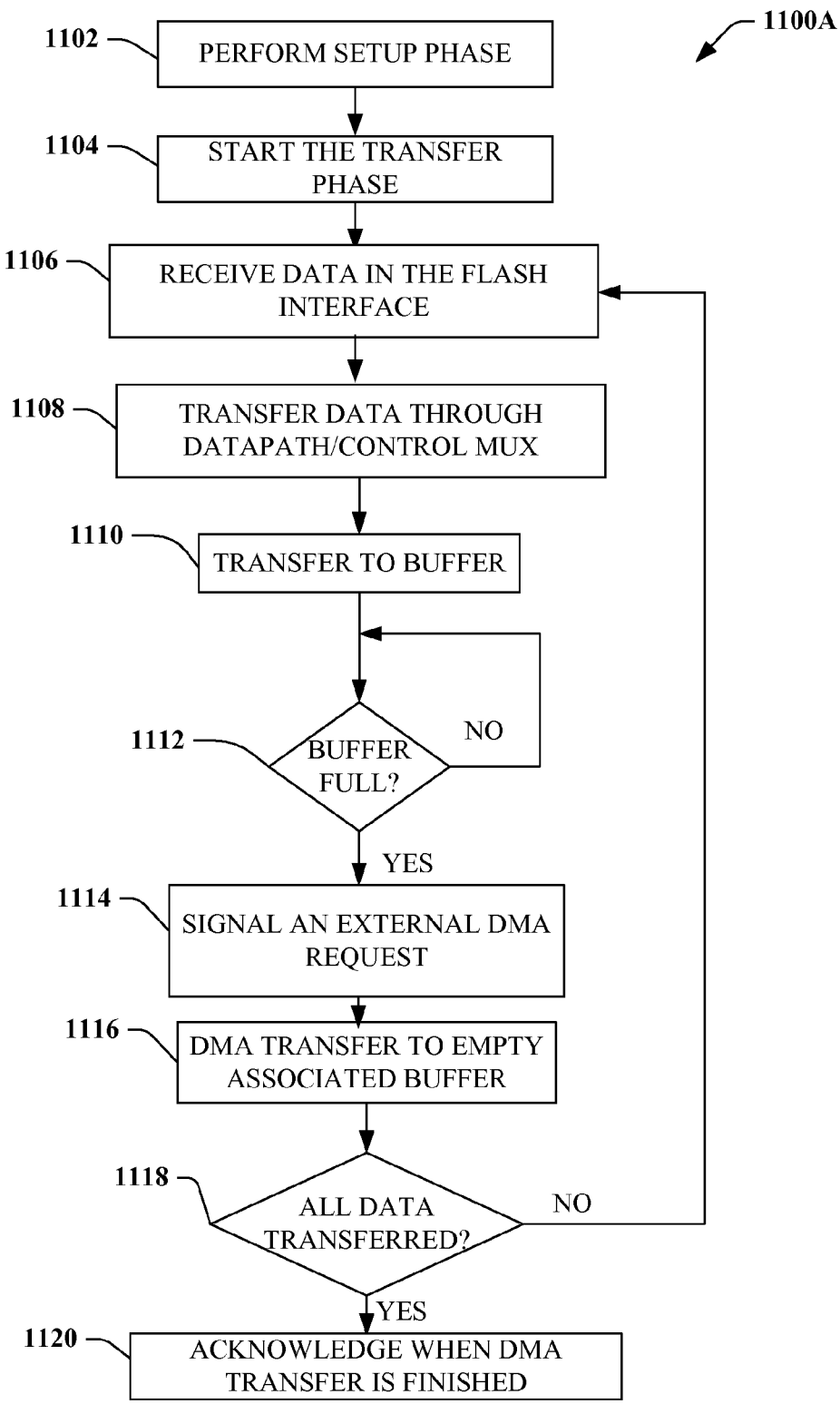
FIGS. 11A-11B illustrate exemplary non-limiting block diagrams of methodologies that facilitate flash read operations in accordance various embodiments of the subject matter disclosed herein.
Figure 11B:
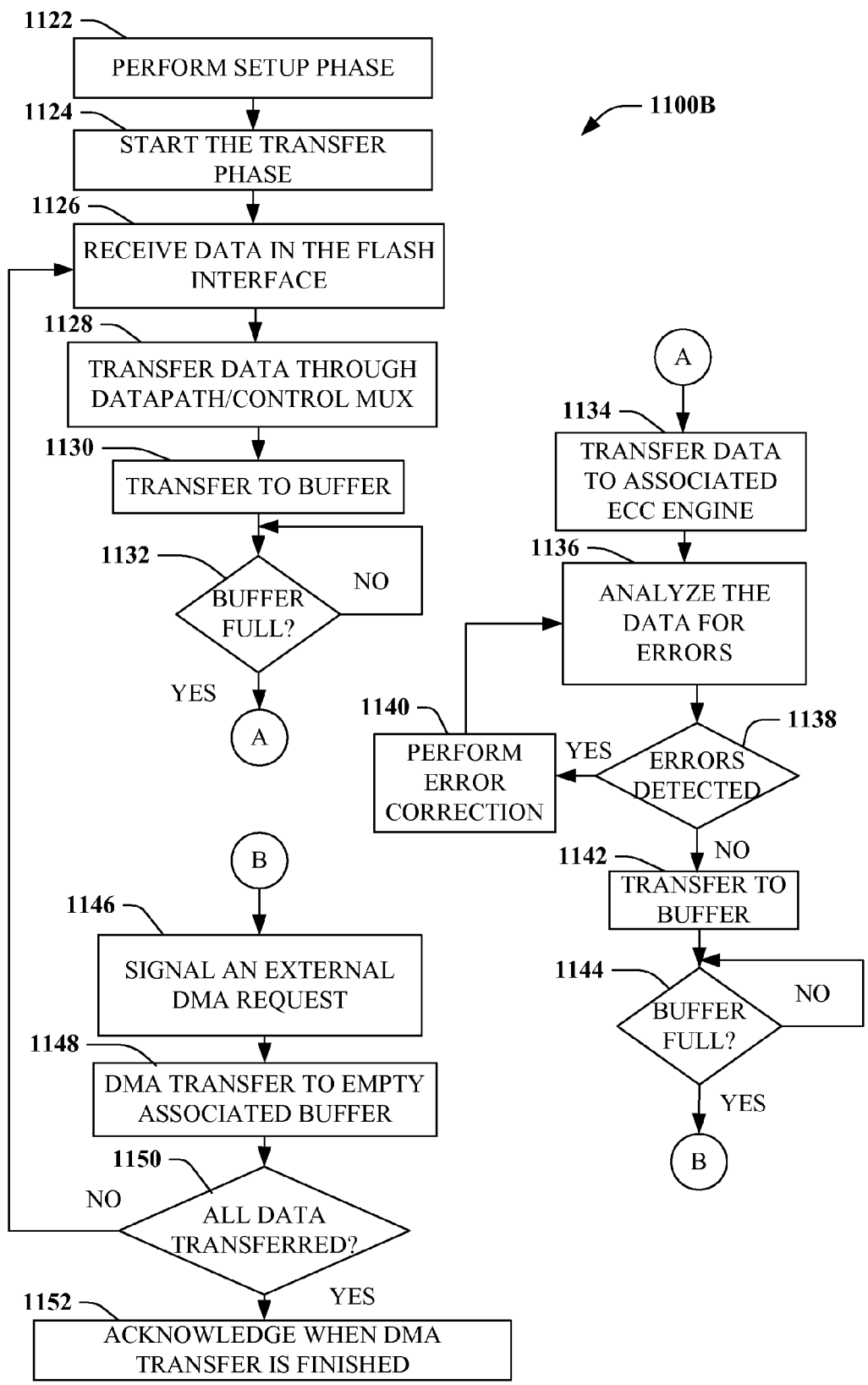

FIGS. 11A-11B illustrate exemplary non-limiting block diagrams of methodologies 1100A-1100B that can facilitate flash read operations in accordance with various embodiments of the subject matter disclosed herein. As with the case for write methodologies 1000A-1000C, the read methodologies can be broadly described in terms of a setup phase and a transfer phase, wherein the setup phase can be described as above with respect to the methodologies of FIGS. 10A-10C.

Referring to FIG. 11A, illustrated is an exemplary non-limiting block diagram of a methodology 1100A that can facilitate flash read operations with ECC disabled in accordance various embodiments of the subject matter disclosed herein. At 1102, a setup phase can be performed. For the example case where software executing in CPU 510 directs reading a page of data (e.g., 2048 bytes, 4096 bytes, etc.) to memory 102, the setup phase can include software configuring associated registers in the FCI 800 to communicate to the NFI 808 and ECC engines 812 the block size to be read. The setup phase can further include software providing commands to the NFI 808 for performing flash memory access operations on memory 102 (e.g., NAND flash memory), providing the flash memory addresses to be read to the NFI 808, providing timing parameters, and setting a variety of configuration cases (e.g., ECC mode enabled or disabled). At 1104, the transfer phase can be started. For example, once the setup phase is complete and the system is ready to read the data, the methodologies 1100A-1100B can include software switching a "GO" bit to facilitate starting the transfer phase.

At 1106, data is received in the NFI 808 from memory 102 (e.g., NAND flash memory). At 1108, the data is transferred via DataPath/Control Mux 814 to buffer 810 at 1110. For example, the data transfer can continue until buffer 810 is full and/or all data associated with a data transfer has been provided the buffer 810 (e.g., even though the buffer 810 is not completely filled). At 1112, if the buffer 810 is determined to be full (and/or all data has been transferred to the buffer 810), the methodology 1100A can proceed to empty the buffer to provide the data to the host system. To that end, at 1114, an external DMA request can be signaled. For instance, the DataPath/Control Mux 814 can signal an external DMA request (e.g., via dma_req 816) to facilitate DMA transfer to empty the associated buffer.

At 1116, the associated buffer can be emptied via DMA transfer. At 1118, a determination can be made regarding whether all the data has been transferred. If it is determined that there is more data to be transferred, methodology 1100B can return to reference numeral 1106, where the process acts of receiving data 1106, filling (1108, 1110) and emptying (1114, 1116) buffer 810 can continue until all the blocks have been transferred. If, at 1118, it is determined that all the data associated with an operation(s) has been transferred, at 1120, an acknowledgement can be made and/or provided that the DMA transfer is finished (e.g., via dma_finish 820).

Referring to FIG. 11B, illustrated is an exemplary non-limiting block diagram of a methodology 1100B that can facilitate flash read operations with ECC enabled in accordance with various embodiments of the subject matter disclosed herein. At 1122, a setup phase can be performed. For the example case where software executing in CPU 510 directs reading a page of data (e.g., 2048 bytes, 4096 bytes, etc.) to memory 102, the setup phase can include software configuring associated registers in the FCI 800 to communicate to the NFI 808 and ECC engines 812 the block size to be read. The setup phase can further include software providing commands to the NFI 808 for performing flash memory access operations on memory 102 (e.g., NAND flash memory), providing the flash memory addresses to be read to the NFI 808, providing timing parameters, and setting a variety of configuration cases (e.g., ECC mode enabled or disabled).

At 1124, the transfer phase can be started. For example, once the setup phase is complete and the system is ready to read the data, the methodologies 1100A-1100B can include software switching a "GO" bit to facilitate starting the transfer phase. At 1126, data can be received in the NFI 808 from memory 102 (e.g., NAND flash memory). At 1128, the data can be transferred via DataPath/Control Mux 814 to buffer 810 at 1130. For example, the data transfer can continue until buffer 810 is full, and/or all data associated with a data transfer has been provided the buffer 810 (e.g., even though the buffer 810 is not completely filled). At 1132, if the buffer 810 is determined to be full (and/or all data has been transferred to the buffer 810), the methodology 1100B can proceed to provide error detection and correction. To that end, at 1134 data can be transferred to the associated ECC engine.

At 1136, the data can be analyzed for errors. For instance, error detection according to the methods described herein can be performed. At 1138, if errors are detected, the correctable errors can be corrected at 1140. If no errors are detected, the data can be transferred back to buffer 808 for transfer to the host system. At 1144, if the buffer 810 is determined to be full, and/or all data associated with a data transfer has been provided the buffer 810 (e.g., even though the buffer 810 is not completely filled), the methodology 1100B can proceed to empty the buffer to provide the data to the host system. To that end, at 1146, an external DMA request can be signaled. For instance, the DataPath/Control Mux 814 can signal an external DMA request (e.g., via dma_req 816) to facilitate DMA transfer to empty the associated buffer. At 1148, the associated buffer can be emptied via DMA transfer.

At 1150, a determination can be made regarding whether all the data has been transferred. If it is determined that there is more data to be transferred, methodology 1100B can return to reference numeral 1126, where the process acts of receiving data 1126, filling (1128, 1130), error detection and correction (1134-1140) and emptying (1146, 1148) buffer 810 can continue until all the blocks have been transferred. If, at 1150, it is determined that all data associated with an operation(s) has been transferred, at 1152, an acknowledgement can be made and/or provided that the DMA transfer is finished (e.g., via dma_finish 820).

It is to be understood and appreciated that the computer-implemented programs and software can be implemented within a standard computer architecture. While some aspects of the disclosure have been described above in the general context of computer-executable instructions that may run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone, watch), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A method comprising:
    configuring a flash memory controller to be connected to a first flash memory device to facilitate executing flash memory access operations on a first subset of data associated with the first flash memory device;
    analyzing a block of data, comprising the first subset of data and error correction information associated with the first subset of data, as the block of data is being read from the first flash memory device and transferred to a buffer to facilitate detecting and correcting one or more erroneous bits of data in the first subset of data based at least in part on the error correction information;
    storing the first subset of data and the error correction information in the buffer after the analyzing of the block of data;
    correcting the one or more erroneous bits of data in the first subset of data based at least in part on the error correction information while the first subset of data and the error correction information are stored in the buffer to produce a first subset of corrected data, based at least in part on results obtained from the analyzing of the first subset of data and the error correction information, wherein, to facilitate the correcting of the one or more erroneous bits of data in the first subset of data while the first subset of data and the error correction information are stored in the buffer, the buffer has a storage size that is sufficient to simultaneously store the first subset of data and the error correction information of the block of data when the block of data is transferred to the buffer, wherein the error correction information is a set of redundant bytes of data, wherein the set of redundant bytes of data was generated in connection with a write operation to write the first subset of data to the first flash memory device, associated with the first subset of data, and stored with the first subset of data in the first flash memory device during the write operation, and is usable to facilitate the correcting of the one or more erroneous bits of data; and
    transferring the first subset of corrected data as an output from the buffer.

2. The method of claim 1, wherein the configuring further comprises configuring flash memory timing in the flash memory controller and indicating, in the flash memory controller for the first subset of data, one or more of a flash memory device, a data size, a column address, or a row address, based at least in part on a first command sequence.

3. The method of claim 2, wherein the configuring the flash memory timing further comprises configuring the flash memory timing by writing to read and write timing registers of the flash memory controller, and wherein the method further comprises:
    storing micro-operations in one or more micro-operation sequence registers of the flash memory controller;
    indicating for the first subset of data, by configuring in the flash memory controller, a flash memory device select indicator, a data size register, a column address register, and a row address register, according to the first command sequence; and
    storing the first command sequence in a command register of the flash memory controller based at least in part on the micro-operations stored in the one or more micro-operation sequence registers.

4. The method of claim 1, further comprising:
    generating a first command sequence comprising a first subset of micro-operations of a plurality of available micro-operations associated with a flash memory interface standard, wherein the first subset of micro-operations are supported by the first flash memory device and are in a first specified order, based at least in part on a first set of operational characteristics associated with the first flash memory device;
    generating a second command sequence comprising a second subset of micro-operations of the plurality of available micro-operations, wherein the second subset of micro-operations are supported by a second flash memory device connected to the flash memory controller and are in a second specified order, based at least in part on a second set of operational characteristics associated with the second flash memory device, and wherein the second flash memory device is different from the first flash memory device and the second set of operational characteristics is different from the first set of operational characteristics;
    executing the first command sequence in accordance with the first specified order to facilitate executing a first type of flash memory access operation on the first subset of data associated with the first flash memory device; and
    executing the second command sequence in accordance with the second specified order to facilitate executing the first type of flash memory access operation on a second subset of data associated with the second flash memory device.

5. The method of claim 4, wherein the executing the first command sequence further comprises:
    executing the first command sequence by executing the first subset of micro-operations in accordance with the first specified order; and
    performing error detection and correction and buffering for the first subset of data using one or more of a plurality of buffer and error detection and correction engine sets of the flash memory controller.

6. The method of claim 5, wherein the performing error detection and correction further comprises determining the error correction information associated with the first subset of data.

7. The method of claim 6, wherein the determining the error correction information is performed by alternating between a first buffer and error detection and correction engine set and a second buffer and error detection and correction engine set of the plurality of buffer and error detection and correction engine sets.

8. The method of claim 5, wherein the performing error detection and correction further comprises the analyzing of the first subset of data and the error correction information substantially in real time to facilitate the correcting of the one or more erroneous bits of data in the first subset of data.

9. The method of claim 1, wherein the analyzing the error correction information of the block of data is performed by alternating between a first buffer and error detection and correction engine set and a second buffer and error detection and correction engine set of the plurality of buffer and error detection and correction engine sets.

10. The method of claim 1, further comprising:
determining an indication of flash memory access completion, wherein the determining an indication of flash memory access completion comprises one of polling a micro-operation status register of the flash memory controller to indicate completion of a first command sequence associated with the first flash memory device, or providing an interrupt signal to indicate completion of flash memory access.

11. The method of claim 1, wherein the first flash memory device comprises at least one of a NOR flash memory or a NAND flash memory.

12. The method of claim 1, further comprising:
generating a set of information that indicates at least one of whether the detecting and the correcting of the one or more erroneous bits of data in the first subset of data is complete, whether the one or more erroneous bits of data in the first subset of data have been corrected, or whether an erroneous bit of data of the one or more erroneous bits of data has not been corrected.

13. A system, comprising:
a plurality of data buffers configured to store data in transit between a host processor and one or more flash memory devices comprising a first flash memory device, wherein the data comprises a first subset of data;
a plurality of error detection and correction engines,
wherein each of the plurality of error detection and correction engines is associated with a respective one of the plurality of data buffers, a first error detection and correction engine of the plurality of error detection and correction engines analyzes a set of data, comprising the first subset of data and error correction data associated with the first subset of data, as the set of data is being read from the first flash memory device and transferred to a first data buffer of the plurality of data buffers to facilitate detection and correction of one or more erroneous bits of data in the first subset of data in accordance with a predetermined mode of error detection and correction,
wherein the first subset of data and the error correction data are stored in the first data buffer after the analysis of the first subset of data and the error correction data, and the first error detection and correction engine corrects the one or more erroneous bits of data while the first subset of data and the error correction data are stored in the first data buffer to produce a first subset of corrected data stored in the first data buffer, based at least in part on results of the analysis of the first subset of data and the error correction data,
wherein, to facilitate the correction of the one or more erroneous bits of data in the first subset of data while the first subset of data and the error correction data are stored in the first data buffer, the first data buffer has an amount of storage that is sufficient to simultaneously store the first subset of data and the error correction data that are part of a block of data when the block of data is transferred to the first data buffer, wherein the error correction data comprises a set of parity data, wherein the set of parity data was generated in connection with a write operation to write the first subset of data to the first flash memory device, associated with the first subset of data, and stored with the first subset of data in the first flash memory device during the write operation, and is usable to facilitate the correcting of the one or more erroneous bits of data, and
wherein the first subset of corrected data is transferred from the first data buffer;
a programmable flash interface component configured to execute one or more flash memory operations, wherein the first error detection and correction engine performs error detection and correction in accordance with the predetermined mode of error detection and correction substantially concurrent with execution of one of the one or more flash memory operations by the programmable flash interface component; and
a flash memory controller component configured to be connected to the first flash memory device to facilitate the execution of the one or more flash memory operations associated with the first flash memory device.

14. The system of claim 13, further comprising:
a plurality of registers configured to facilitate configuration of the programmable flash interface component to facilitate execution of the one or more flash memory operations to provide access to at least the first flash memory device;
an external interface that is accessible by a processor communicatively coupled an interface, the processor is operable to configure and control the programmable flash interface component via one or more of the plurality of registers;
a configurable control component configured to direct transfer of data in the system; and
a second plurality of registers that configures the configurable control component to provide a plurality of modes of operation of the plurality of data buffers and respectively associated error detection and correction engines, wherein the plurality of modes of operation comprise bypass mode, single error detection and correction mode, and multiple error detection and correction mode.

15. The system of claim 13, further comprising a direct memory access interface to facilitate direct access to a host computer memory.

16. The system of claim 13, wherein the first flash memory device comprises at least one of a NOR flash memory or a NAND flash memory.

17. An electronic device comprising the system of claim 13.

18. The electronic device of claim 17, the electronic device is one of a computer, a cellular phone, a digital phone, a video device, a smart card, a personal digital assistant, a television, an electronic game, a digital camera, an electronic organizer, an audio player, an audio recorder, an electronic device associated with digital rights management, a Personal Computer Memory Card International Association (PCMCIA) card, a trusted platform module (TPM), an electronic control unit associated with motor vehicles, a global positioning satellite (GPS) unit, an electronic device associated with an airplane, an electronic device associated with an industrial control system, a Hardware Security Module (HSM), a set-top box, a secure memory device with computational capabilities, or an electronic device with a tamper-resistant chip.

19. A flash memory controller interface, comprising:
   means for configuring the flash memory controller interface to conform to a flash memory device specification of a flash memory device associated with the flash memory controller interface;
   means for buffering data associated with the flash memory controller interface, wherein the data comprises a first subset of data and error correction information associated with the first subset of data;
   means for analyzing the first subset of data and the error correction information as the first subset of data and the error correction information are being read from the first flash memory device and transferred to the means for buffering data to facilitate detecting and correcting one or more erroneous bits of data in the first subset of data, wherein the first subset of data and the error correction information are stored in the means for buffering data after the analyzing of the first subset of data and the error correction information;
   means for selectively performing error detection and correction of data associated with the first flash memory device to detect and correct the one or more erroneous bits of data in the first subset of data while the first subset of data and the error correction information are stored in the means for buffering data to generate a first subset of corrected data, based at least in part on results obtained from the analyzing of the first subset of data and the error correction information performed by the means for analyzing, wherein the means for selectively performing error detection and correction is configured to detect and correct data, in accordance with a selected mode of error detection and correction, substantially concurrent with executing a flash memory access operation, and wherein, to facilitate the correcting of the one or more erroneous bits of data in the first subset of data while the first subset of data and the error correction information are stored in the means for buffering data, the means for buffering data has a storage size that is sufficient to simultaneously store the first subset of data and the error correction information that are part of a block of data when the block of data is transferred to the means for buffering data, wherein the error correction information comprises redundant bytes of data usable to facilitate the correcting of the one or more erroneous bits of data;
   means for transferring the first subset of corrected data as an output from the means for buffering data; and
   means for interfacing to facilitate receiving and sending data from and to the first flash memory device.

20. The flash memory controller interface of claim 19, further comprising:
   means for controlling the flash memory controller interface to perform read and write operations on the first flash memory device and to configure the means for selectively performing error detection and correction of data, wherein the means for controlling comprises means for selecting an error detection and correction bypass mode, a single error detection and correction mode, or a dual error detection and correction mode.

* * * * *